(12) United States Patent
Takada et al.

(10) Patent No.: US 12,300,343 B2
(45) Date of Patent: May 13, 2025

(54) MEMORY SYSTEM

(71) Applicant: Kioxia Corporation, Tokyo (JP)

(72) Inventors: Marie Takada, Yokohama Kanagawa (JP); Masanobu Shirakawa, Chigasaki Kanagawa (JP); Hideki Yamada, Yokohama Kanagawa (JP); Ryo Yamaki, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 258 days.

(21) Appl. No.: 18/053,896

(22) Filed: Nov. 9, 2022

(65) Prior Publication Data
US 2023/0420067 A1 Dec. 28, 2023

(30) Foreign Application Priority Data

Jun. 22, 2022 (JP) .................................. 2022-100559

(51) Int. Cl.
*G11C 16/06* (2006.01)
*G11C 11/4074* (2006.01)
*G11C 11/4096* (2006.01)
*G11C 29/52* (2006.01)

(52) U.S. Cl.
CPC .......... *G11C 29/52* (2013.01); *G11C 11/4074* (2013.01); *G11C 11/4096* (2013.01)

(58) Field of Classification Search
CPC .. G11C 29/52; G11C 11/4074; G11C 11/4096
USPC .................................................. 365/185.09
See application file for complete search history.

(56) References Cited

U.S. PATENT DOCUMENTS

| | | | |
|---|---|---|---|
| 9,019,770 B2 * | 4/2015 | Lin ..................... | G11C 16/3436 365/185.12 |
| 9,069,659 B1 | 6/2015 | Sabbag et al. | |
| 9,349,489 B2 * | 5/2016 | Desireddi .......... | G11C 16/3495 |
| 9,595,320 B2 * | 3/2017 | Wu ..................... | G11C 16/3454 |
| 9,720,754 B2 | 8/2017 | Karakulak et al. | |
| 9,892,799 B1 * | 2/2018 | Lin ........................ | G11C 16/14 |
| 10,719,396 B2 | 7/2020 | Asami et al. | |
| 10,866,860 B2 | 12/2020 | Kurose et al. | |
| 11,024,396 B2 * | 6/2021 | Chen ....................... | G11C 11/56 |
| 11,029,890 B1 * | 6/2021 | Parthasarathy .... | G11C 16/3495 |
| 11,056,199 B2 | 7/2021 | Papandreou et al. | |

(Continued)

FOREIGN PATENT DOCUMENTS

| | | | | |
|---|---|---|---|---|
| JP | 2019-164850 A | | 9/2019 | |
| JP | 2020047318 A | * | 3/2020 | .......... G06F 11/1068 |

(Continued)

*Primary Examiner* — Viet Q Nguyen
(74) *Attorney, Agent, or Firm* — Maier & Maier, PLLC

(57) ABSTRACT

A memory system includes a nonvolatile memory including memory cells each configured to store first and second bits, and a memory controller. The memory controller is configured to: read first data by using a first voltage to a first read process that reads data corresponding to the first bit from the memory cells; read second data by using a second voltage to a second read process that reads data corresponding to the second bit from the memory cells; in a case where an error correction process of the first data is successful, determine a third voltage, based on the first data and third data that is obtained by error-correcting the first data; and update a first read voltage that is used to the first read process, from the first voltage to the third voltage.

19 Claims, 21 Drawing Sheets

(56) References Cited

U.S. PATENT DOCUMENTS

| | | | |
|---|---|---|---|
| 11,086,569 B2 | 8/2021 | Ng et al. | |
| 11,195,585 B2 | 12/2021 | Tokutomi et al. | |
| 11,277,666 B2* | 3/2022 | Aher | H04N 21/47217 |
| 11,334,432 B2* | 5/2022 | Kurose | G11C 29/52 |
| 11,609,814 B2* | 3/2023 | Kurose | G11C 29/52 |
| 11,960,989 B2* | 4/2024 | Zhang | G11C 11/5642 |
| 12,001,687 B2* | 6/2024 | Takada | G11C 16/3418 |
| 2020/0090763 A1* | 3/2020 | Tokutomi | G06F 11/1068 |

FOREIGN PATENT DOCUMENTS

| | | | | |
|---|---|---|---|---|
| JP | 2020-155174 A | | 9/2020 | |
| JP | 2024043938 A | * | 4/2024 | G11C 11/5642 |

* cited by examiner

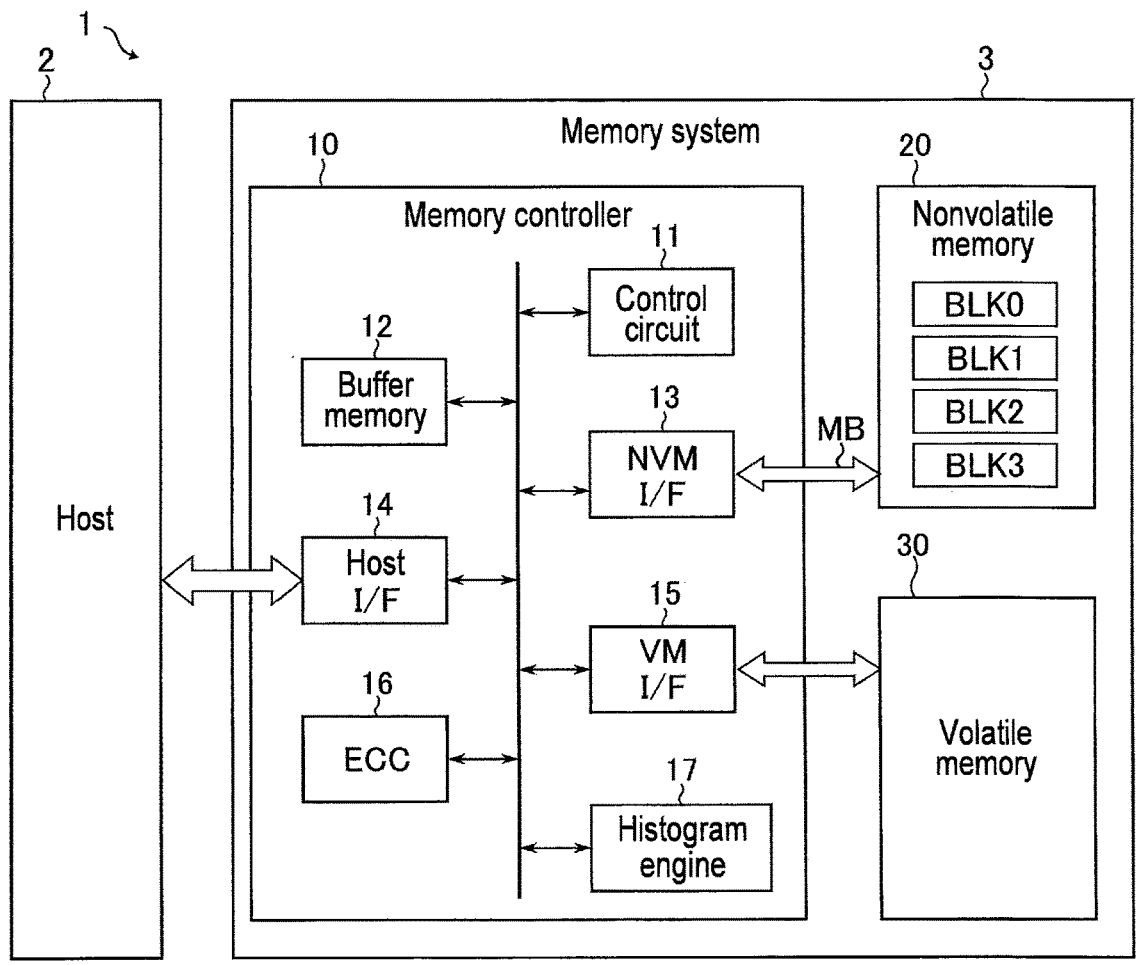
F I G. 1
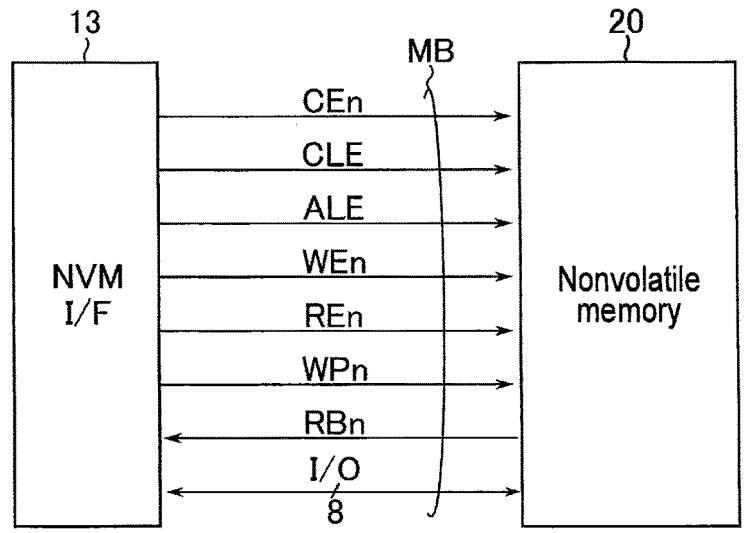
F I G. 2

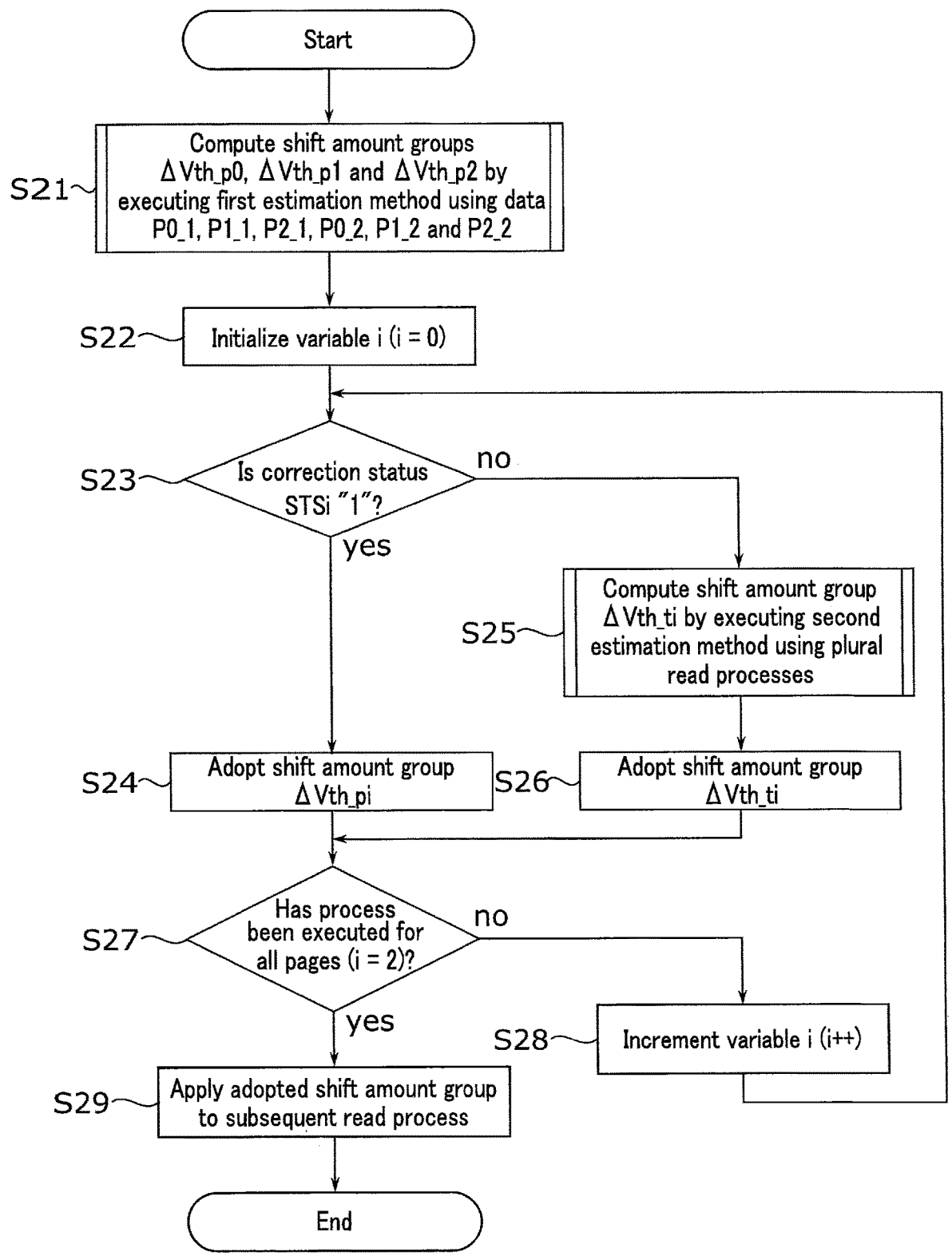
F I G. 7

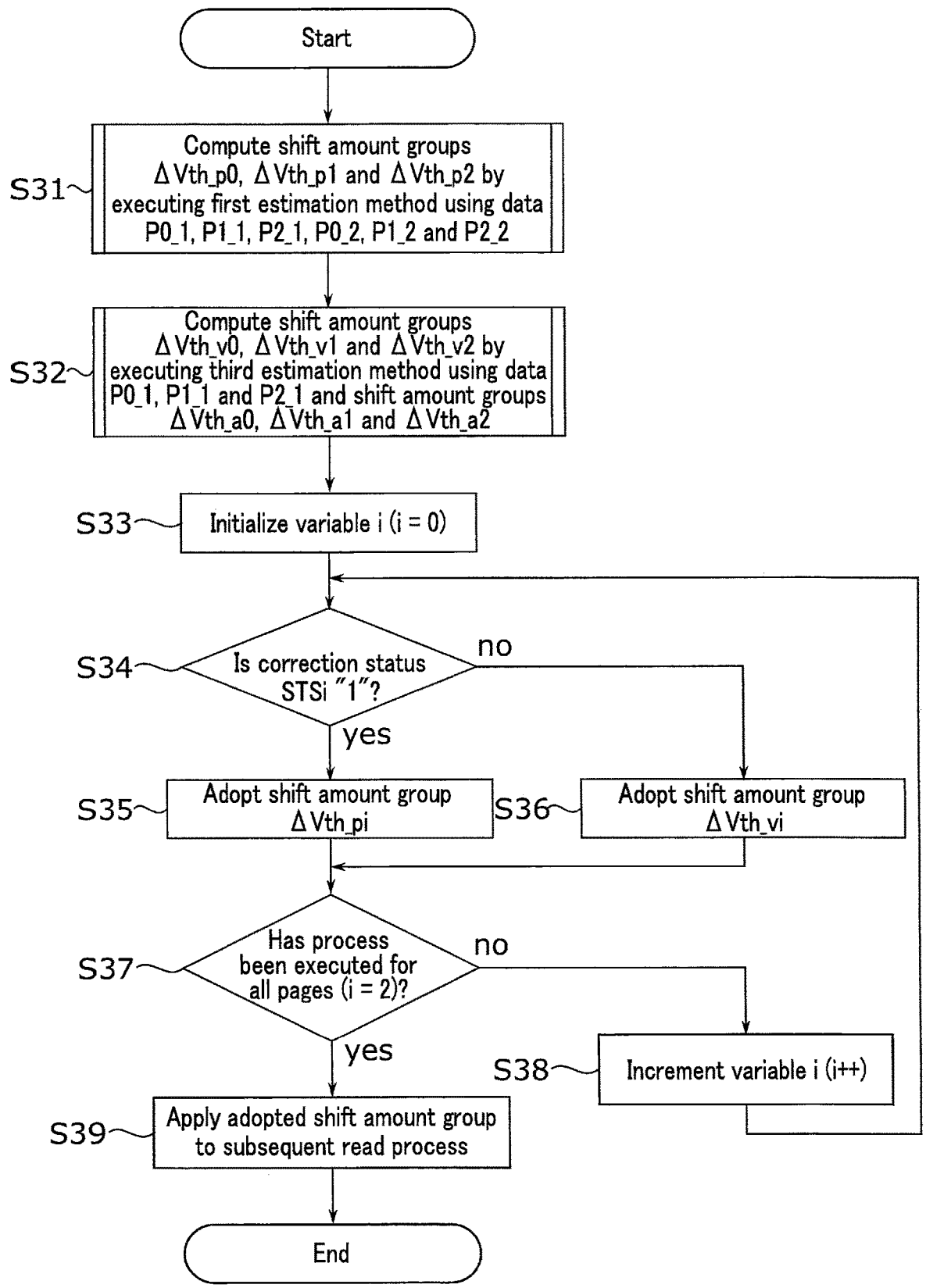
F I G. 10

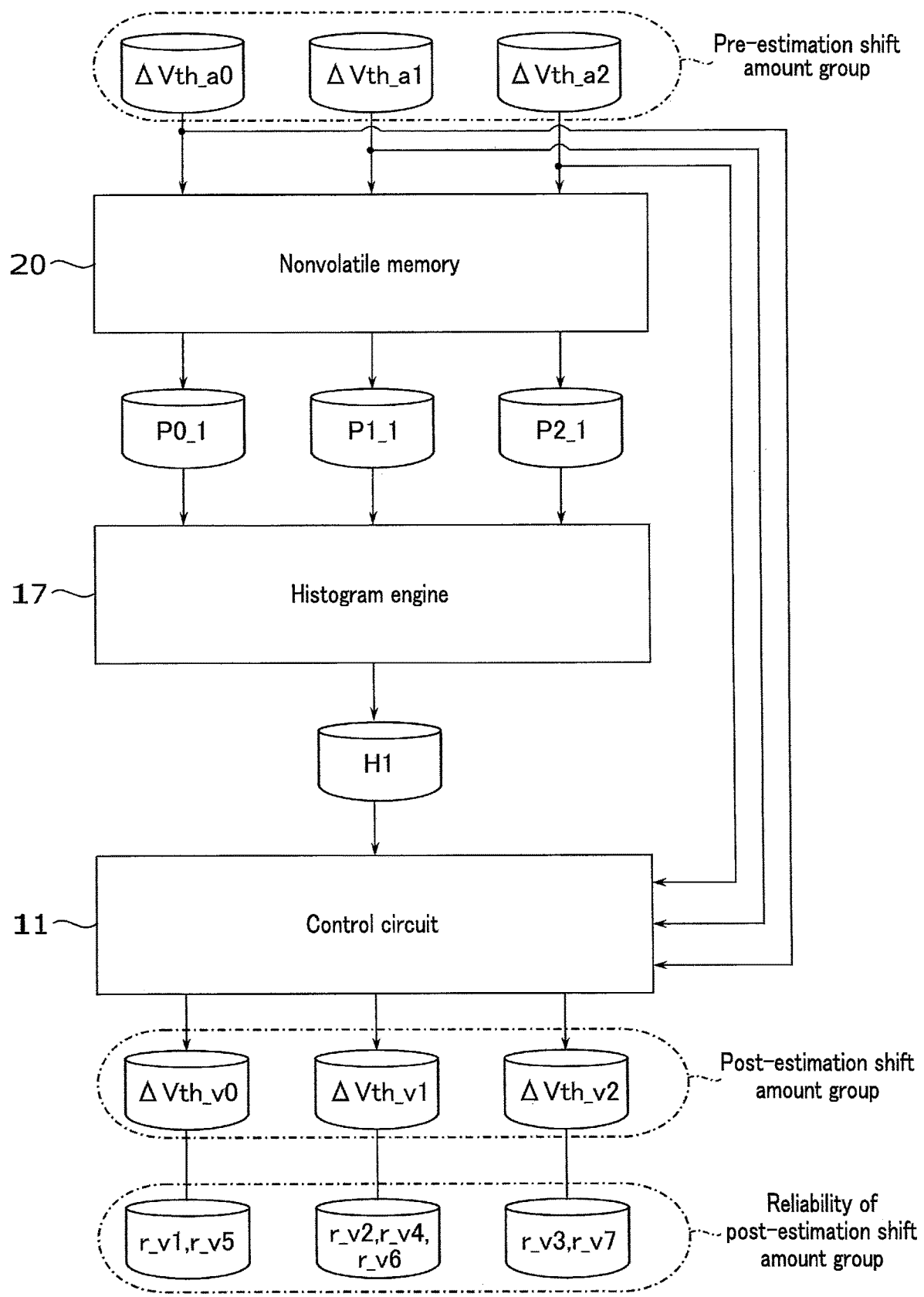
F I G. 11

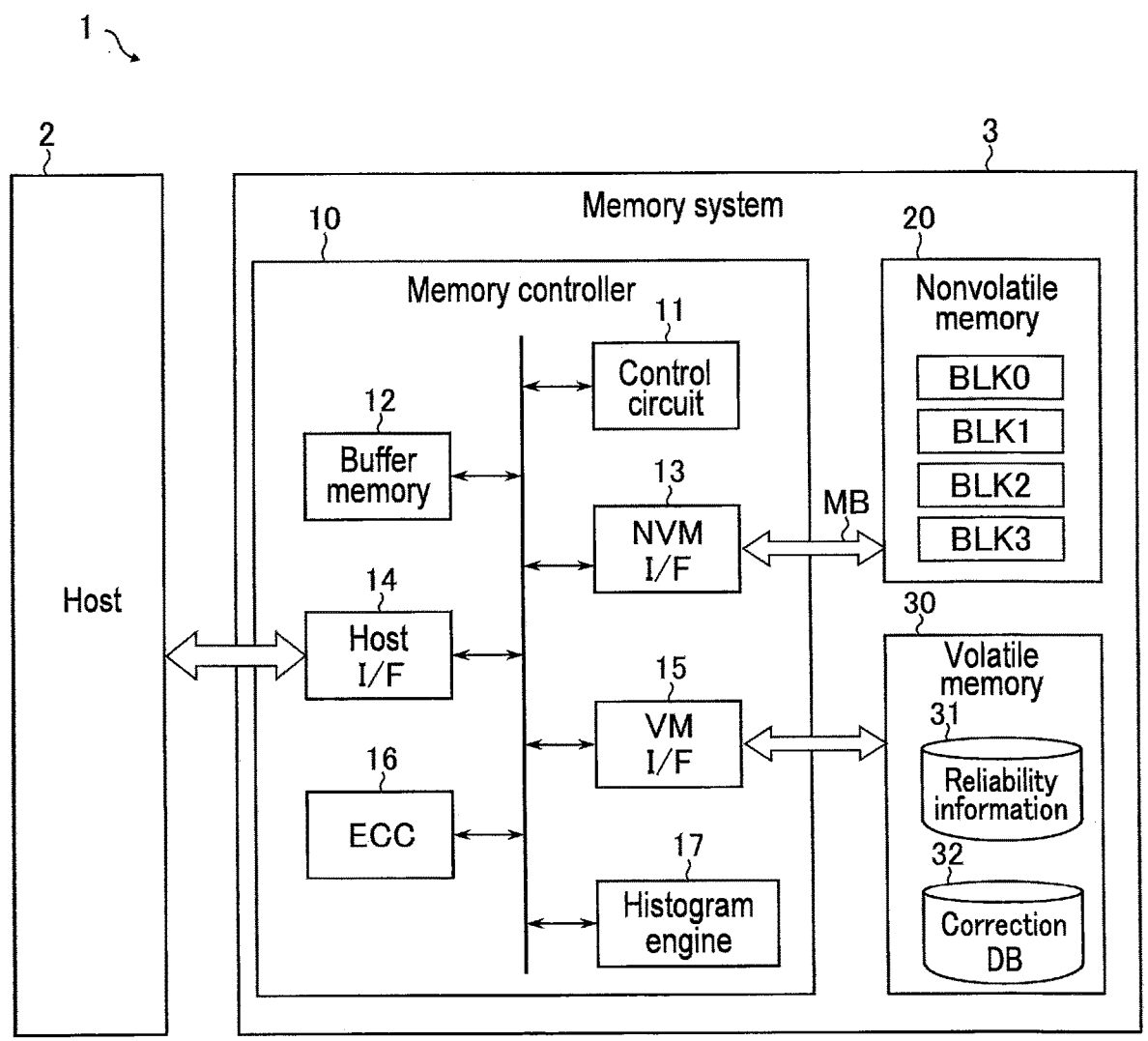
F I G. 12

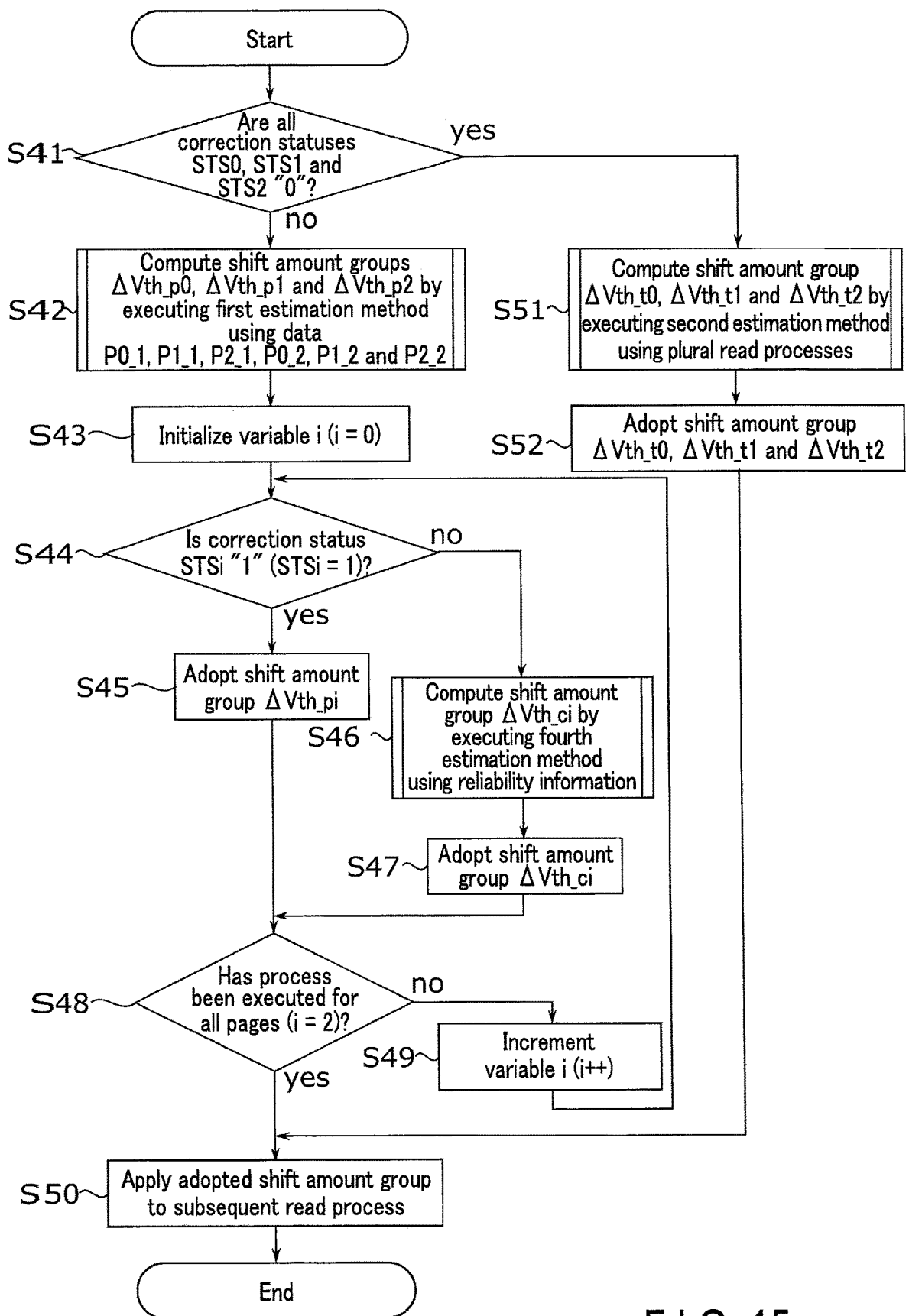
F I G. 15

Case of i = 2, STS0 = 0, STS1 = 1, STS2 = 0, and $k_3 = 4$

Case of $\Delta R4 = -12$

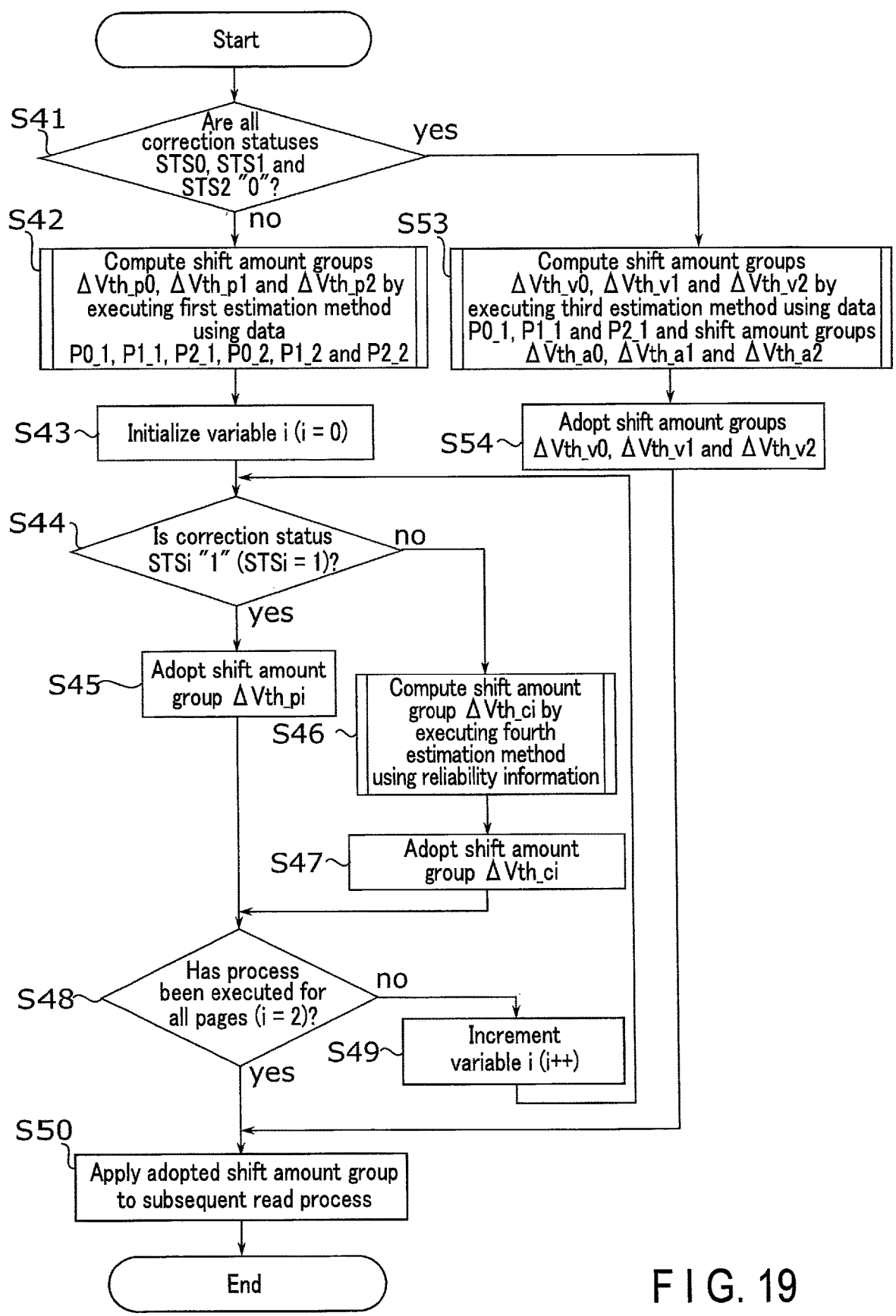
F I G. 19

MEMORY SYSTEM

CROSS-REFERENCE TO RELATED APPLICATIONS

This application is based upon and claims the benefit of priority from prior Japanese Patent Application No. 2022-100559, filed Jun. 22, 2022, the entire contents of which are incorporated herein by reference.

FIELD

Embodiments described herein relate generally to a memory system.

BACKGROUND

A memory system is known which includes a NAND flash memory as a nonvolatile memory, and a memory controller that controls the nonvolatile memory. The memory controller includes a function of estimating an optimal read voltage for reading data from the nonvolatile memory.

BRIEF DESCRIPTION OF THE DRAWINGS

FIG. 1 is a block diagram illustrating an example of a configuration of an information processing system according to a first embodiment.

FIG. 2 is a block diagram illustrating an example of signals used in a memory bus according to the first embodiment.

FIG. 7 is a flowchart illustrating a first example of the shift amount estimation process in the memory system according to the first embodiment.

FIG. 10 is a flowchart illustrating a second example of the shift amount estimation process in the memory system according to the first embodiment.

FIG. 11 is a view illustrating an example of a third estimation method applied to the shift amount estimation process in the memory system according to the first embodiment.

FIG. 12 is a block diagram illustrating an example of a configuration of an information processing system according to a second embodiment.

FIG. 15 is a flowchart illustrating a third example of the shift amount estimation process in the memory system according to the second embodiment.

FIG. 19 is a flowchart illustrating a fourth example of the shift amount estimation process in the memory system according to the second embodiment.

DETAILED DESCRIPTION

Figure 3:
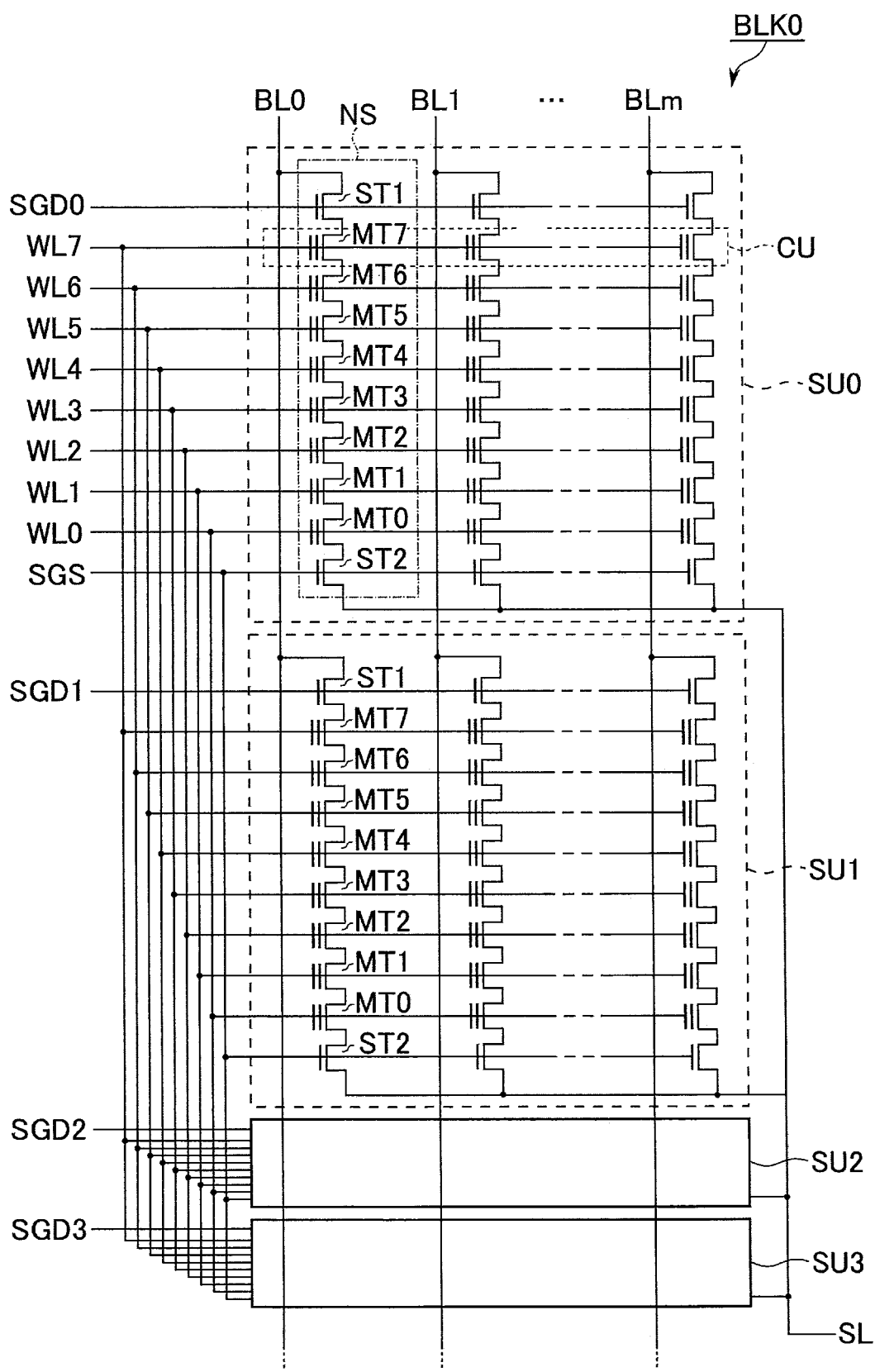
FIG. 3 is a circuit diagram illustrating an example of a configuration of a nonvolatile memory according to the first embodiment.

In general, according to one embodiment, a memory system includes a nonvolatile memory including a plurality of memory cells; and a memory controller. Each of the memory cells is configured to store a first bit and a second bit, and the memory controller is configured to: read first data by using a first voltage to a first read process that reads data corresponding to the first bit from the memory cells; read second data by using a second voltage to a second read process that reads data corresponding to the second bit from the memory cells; in a case where an error correction process of the first data is successful, determine a third voltage, based on the first data and third data that is obtained by error-correcting the first data; and update a first read voltage that is used to the first read process, from the first voltage to the third voltage.

Hereinafter, embodiments will be described with reference to the accompanying drawings. In the description below, components having the same function and structure are denoted by like reference numerals. In addition, when a plurality of components having a common reference numeral are distinguished, subscripts are added to the common reference numeral to distinguish the components. In a case where distinction between the components is not particularly needed, the components are denoted by the common reference numeral alone, without subscripts being added.

1. First Embodiment

1.1 Configuration

1.1.1 Information Processing System

A configuration of an information processing system according to a first embodiment is described.

FIG. 1 is a block diagram illustrating an example of a configuration of an information processing system according to the first embodiment. As illustrated in FIG. 1, an information processing system 1 includes a host 2 and a memory system 3.

The host 2 is a data processing device that processes data by using the memory system 3. The host 2 is, for example, a personal computer, or a server in a data center.

The memory system 3 is a storage device that is configured to be connected to the host 2. The memory system 3 is, for example, a memory card such as an SD™ card, a UFS (Universal Flash Storage), or an SSD (Solid State Drive). Responding to a request from the host 2, the memory system 3 executes a write process, a read process and an erase process of data. The memory system 3 may execute a write process, a read process and an erase process as internal processes.

1.1.2 Memory System

An internal configuration of the memory system according to the first embodiment is described.

The memory system 3 includes a memory controller 10, a nonvolatile memory 20, and a volatile memory 30.

The memory controller 10 is composed of, for example, an integrated circuit such as an SoC (System-on-a-Chip). Based on a request from the host 2, the memory controller 10 controls the nonvolatile memory 20.

Specifically, the memory controller 10, for example, writes write data into the nonvolatile memory 20, based on a write request from the host 2. In addition, based on a read request from the host 2, the memory controller 10 reads read data from the nonvolatile memory 20. Further, the memory controller 10 sends data, which is based on the read data, to the host 2.

The nonvolatile memory 20 is, for example, a NAND flash memory. The nonvolatile memory 20 includes a plurality of blocks BLK (BLK0 to BLK3). Each of the blocks BLK includes a plurality of memory cells. Each memory cell stores data nonvolatilely. The block BLK is, for example, an erase unit of data.

The volatile memory 30 is, for example, a DRAM (Dynamic Random Access Memory). For example, information or the like relating to a read voltage, which is used when reading out data from the nonvolatile memory 20, is stored in the volatile memory 30.

1.1.3 Memory Controller

Next, also referring to FIG. 1, an internal configuration of the memory controller 10 is described. The memory controller 10 includes a control circuit 11, a buffer memory 12, a nonvolatile memory interface circuit (NVM I/F) 13, a host interface circuit (host I/F) 14, a volatile memory interface circuit (VM I/F) 15, an ECC (Error Correction and Check) circuit 16, and a histogram engine 17. The functions of the control circuit 11, buffer memory 12, nonvolatile memory interface circuit 13, host interface circuit 14, volatile memory interface circuit 15, ECC circuit 16 and histogram engine 17, which will be described below, can be implemented by any of dedicated hardware, processors that execute programs, or a combination thereof.

The control circuit 11 is a circuit that controls the entirety of the memory controller 10. The control circuit 11 includes, for example, a processor such as a CPU (Central Processing Unit), a ROM (Read Only Memory), and a RAM (Random Access Memory).

The buffer memory 12 is, for example, an SRAM (Static Random Access Memory). The buffer memory 12 executes buffering of data between the host 2 and the nonvolatile memory 20. The buffer memory 12 temporarily stores write data and read data. Examples of information stored in the buffer memory 12 will be described later.

The nonvolatile memory interface circuit 13 controls communication between the memory controller 10 and the nonvolatile memory 20. The nonvolatile memory interface circuit 13 is connected to the nonvolatile memory 20 via a memory bus MB. The memory bus MB supports, for example, an SDR (single data rate) interface, a toggle DDR (double data rate) interface, or an ONFI (Open NAND flash interface).

The host interface circuit 14 controls communication between the memory controller 10 and the host 2. The host interface circuit 14 is connected to the host 2 via a host bus. The host bus supports, for example, an SD™ interface, SAS (Serial Attached SCSI (Small Computer System Interface)), SATA (Serial ATA (Advanced Technology Attachment)), or PCIe™ (Peripheral Component Interconnect express).

The volatile memory interface circuit 15 controls communication between the memory controller 10 and the volatile memory 30. A bus connecting the volatile memory 30 and the memory controller 10 supports, for example, a DRAM interface standard.

The ECC circuit 16 executes an error detection process and an error correction process relating to data stored in the nonvolatile memory 20. Specifically, at a time of the write process of data, the ECC circuit 16 adds an error correction code to write data. At a time of the read process of data, the ECC circuit 16 decodes read data, and detects the presence/absence of a fail bit. The fail bit is a bit in data (including one or more bits) read from a certain memory cell, the fail bit being different from a true bit in data written in the memory cell. In addition, when the fail bit is detected, the ECC circuit 16 specifies a location of the fail bit, and executes an error correction process. The method of the error correction process includes, for example, hard bit decoding and soft bit decoding. As a hard bit decoding code used in the hard bit decoding, for example, BCH (Bose-Chaudhuri-Hocquenghem) code or an RS (Reed-Solomon) code can be used. As a soft bit decoding code used in the soft bit decoding, for example, an LDPC (Low Density Parity Check) code can be used. Hereinafter, unless otherwise specified, it is assumed that the hard bit decoding is applied to the error correction process.

The histogram engine 17 executes a histogram generation process that is based on data stored in the nonvolatile memory 20. The histogram engine 17 classifies a plurality of memory cells into some states, based on the data stored in the nonvolatile memory 20. The histogram engine 17 outputs the number of memory cells of each of classified states as a histogram. The histogram that is output by the histogram engine 17 is used, for example, for an estimation process of a shift amount (shift amount estimation process) from a default value of a read voltage that is applied to the read process.

1.1.4 Memory Bus

Next, an example of signals, which are exchanged between the nonvolatile memory 20 and the memory controller 10, is described. FIG. 2 is a block diagram illustrating an example of signals used in the memory bus according to the first embodiment.

The signals used in the memory bus MB are, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. In the present specification, the character "n" added to the end of the name of the signal means that the signal is asserted in the case where the signal is at "L (Low)" level.

The chip enable signal CEn is a signal for enabling the nonvolatile memory 20.

The command latch enable signal CLE and address latch enable signal ALE are signals that notify the nonvolatile memory 20 that the input signals I/O to are a command and an address, respectively.

The write enable signal WEn is a signal for enabling the input signal I/O to be taken in the nonvolatile memory 20.

The read enable signal REn is a signal for reading the output signal I/O from the nonvolatile memory 20.

The write protect signal WPn is a signal for instructing the nonvolatile memory 20 to prohibit write and erase of data.

The ready/busy signal RBn is a signal indicating whether the nonvolatile memory 20 is in a ready state or a busy state. The ready state is a state in which the nonvolatile memory 20 can receive an instruction from the memory controller 10. The busy state is a state in which the nonvolatile memory 20 cannot receive an instruction from the memory controller 10. The "L" level of the ready/busy signal RBn indicates the busy state.

The input/output signal I/O is, for example, an 8-bit signal. The input/output I/O is a substance of the data that is transmitted/received between the nonvolatile memory 20 and the memory controller 10. The input/output signal I/O includes a command, an address, and data such as write data and read data.

1.1.5 Nonvolatile Memory

Next, a configuration of the nonvolatile memory 20 is described. FIG. 3 is a circuit diagram illustrating an example of a configuration according to the first embodiment. FIG. 3 illustrates, by way of example, a configuration of the block BLK0. Configurations of the other blocks BLK1 to BLK3 are the same as the configuration of the block BLK0. The block BLK0 includes, for example, four string units SU0 to SU3. Note that FIG. 3 illustrates configurations of the string units SU2 and SU3 in a simplified manner.

Each string unit SU includes a plurality of NAND strings NS that are associated with bit lines BL0, BL1, . . . , BLm (m is an integer of two or more). The NAND string NS includes, for example, memory cell transistors MT0 to MT7, and select transistors ST1 and ST2.

The memory cell transistor MT includes a control gate and a charge storage layer, and stores data nonvolatilely. Each of the select transistors ST1 and ST2 is used for selecting a string unit SU when various processes are executed.

In each NAND string NS, the memory cell transistors MT0 to MT7 are coupled in series. The select transistor ST1 is coupled between one end of the series-coupled memory cell transistors MT0 to MT7 and the associated bit line BL. The drain of the select transistor ST2 is coupled to the other end of the series-coupled memory cell transistors MT0 to MT7. A source line SL is coupled to the source of the select transistor ST2.

In an identical block BLK, the gates of select transistors ST1 included in the string units SU0 to SU3 are coupled to select gate lines SGD0 to SGD3, respectively. The control gates of the memory cell transistors MT0 to MT7 are coupled to word lines WL0 to WL7, respectively. The gates of the select transistors ST2 are commonly coupled to a select gate line SGS.

The bit lines BL0 to BLm are shared by the blocks BLK0 to BLK3. The same bit line BL is coupled to the NAND strings NS corresponding to the same column address. The word lines WL0 to WL7 are provided for each of the blocks BLK0 to BLK3. The source line SL is shared by the blocks BLK0 to BLK3.

A set of memory cell transistors MT, which are coupled to a common word line WL in one string unit SU, is referred to, for example, as "cell unit CU", and is used as a write unit of data. For example, the storage capacity of the cell unit CU including memory cell transistors MT each storing 1-bit data is defined as "1-page data". In other words, 1-page data is a data area of a 1-bit data string having the number of columns corresponding to the number of memory cell transistors MT in the cell unit CU. The 1-page data is used, for example, as a read unit of data. The cell unit CU may have a storage capacity of two or more pages in accordance with the number of bit data that the memory cell transistor MT stores.

Note that the above-described circuit configuration of the block BLK is merely an example, and is not limited to this. For example, the number of bit lines BL is not limited to three or more, and may be one or two. The number of blocks BLK included in the nonvolatile memory may be designed to be a freely selected number. The number of string units SU included in each block BLK may be designed to be a freely selected number. The number of memory cell transistors MT, and the numbers of select transistors ST1 and ST2, which are included in each NAND string NS, may be designed to be freely selected numbers.

Hereinafter, a case is described in which one memory cell transistor MT can store 3-bit data. In this case, a write mode, in which 3-bit data is stored in the memory cell transistor MT, is also called "TLC (Triple Level Cell) mode". The 3-bit data, which are written by the TLC mode and stored in the memory cell transistor, are called "lower bit", "middle bit" and "upper bit" in the order from the lower bit. In addition, a set of lower bits, which are stored in the memory cell transistors MT included in an identical cell unit CU, is called "lower page" or "P0", a set of middle bits is called "middle page" or "P1", and a set of upper bits is called "upper page" or "P2".

Figures 4, 5:
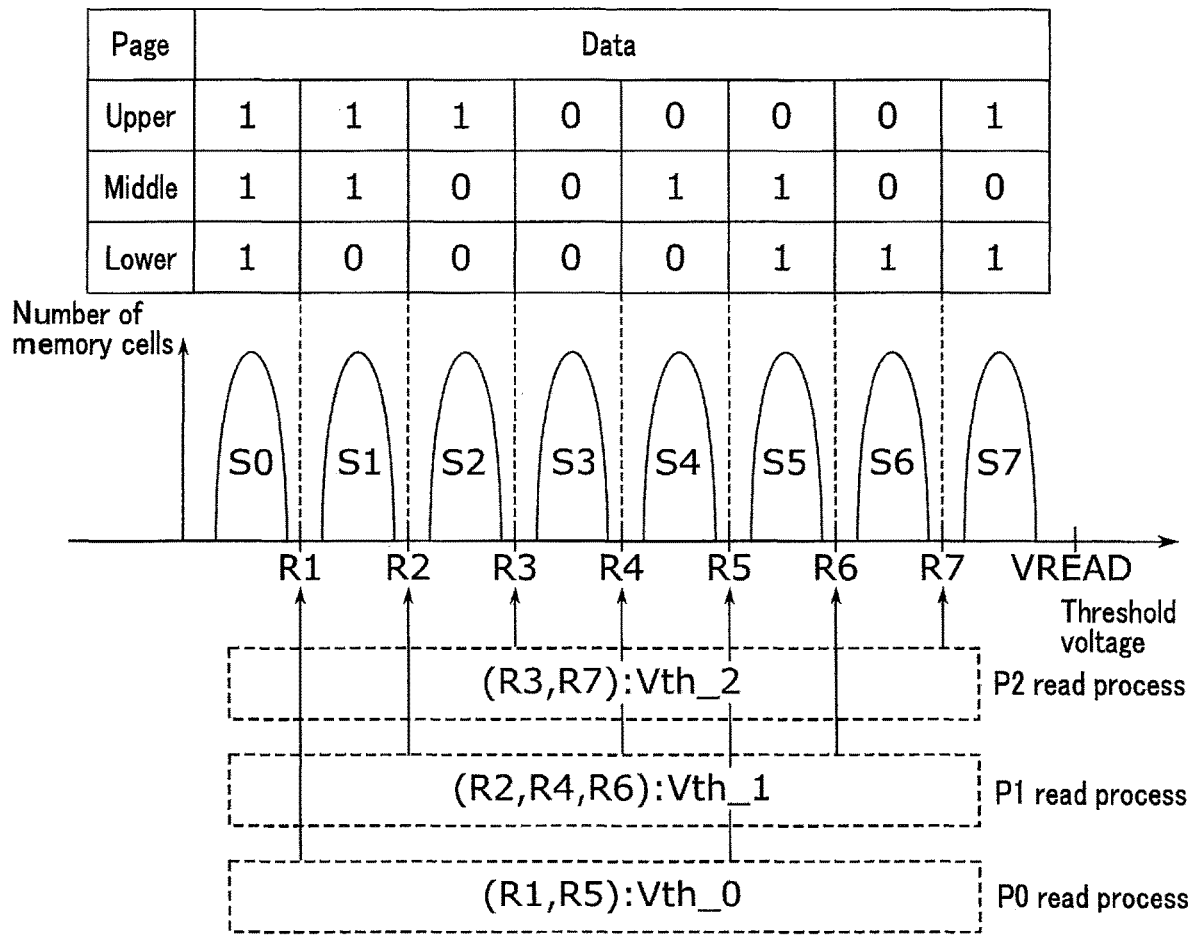
FIG. 4 is a schematic diagram illustrating an example of threshold voltage distributions of a plurality of memory cell transistors according to the first embodiment.
FIG. 5 is a view illustrating an example of information stored in a memory system according to the first embodiment.

FIG. 4 is a schematic diagram illustrating an example of threshold voltage distributions of a plurality of memory cell transistors MT according to the first embodiment. In the case where the memory cell transistor MT stores 3-bit data, the distribution of threshold voltages thereof can be divided into eight threshold voltage distributions. The eight threshold voltage distributions are called an "S0" state, "S1" state, "S2" state, "S3" state, "S4" state, "S5" state, "S6" state and "S7" state in the order from the lowest threshold voltage.

In addition, voltages R1, R2, R3, R4, R5, R6 and R7 illustrated in FIG. 4 are used for distinguishing two mutually neighboring states at a time of the read process. A voltage VREAD is a voltage that is applied to unselected word lines at the time of the read process. The memory cell transistor MT enters the ON state, regardless of the data stored therein, when the voltage VREAD is applied to the gate. The relationship between these voltage values is R1<R2<R3<R4<R5<R6<R7<VREAD.

Of the above-described threshold voltage distributions, the "S0" state corresponds to an erase state of the memory cell transistor MT. The threshold voltage in the "S0" state is less than the voltage R1. The threshold voltage in the "S1" state is the voltage R1 or more, and is less than the voltage R2. The threshold voltage in the "S2" state is the voltage R2 or more, and is less than the voltage R3. The threshold voltage in the "S3" state is the voltage R3 or more, and is less than the voltage R4. The threshold voltage in the "S4" state is the voltage R4 or more, and is less than the voltage R5. The threshold voltage in the "S5" state is the voltage R5 or more, and is less than the voltage R6. The threshold voltage in the "S6" state is the voltage R6 or more, and is less than the voltage R7. The threshold voltage in the "S7" state is the voltage R7 or more, and is less than the VREAD.

The above-described eight threshold voltage distributions are formed by writing 3-bit (3-page) data including a lower bit, a middle bit and an upper bit. In addition, the eight threshold voltage distributions correspond to different 3-bit data. Hereinafter, it is assumed that, in the memory cell transistors MT included in each state, data is allocated to the "upper bit/middle bit/lower bit" as follows.

The memory cell transistor MT included in the "S0" state stores "111" data.

The memory cell transistor MT included in the "S1" state stores "110" data.

The memory cell transistor MT included in the "S2" state stores "100" data.

The memory cell transistor MT included in the "S3" state stores "000" data.

The memory cell transistor MT included in the "S4" state stores "010" data.

The memory cell transistor MT included in the "S5" state stores "011" data.

The memory cell transistor MT included in the "S6" state stores "001" data.

The memory cell transistor MT included in the "S7" state stores "101" data.

A read process of the lower page (P0 read process) uses, as read voltages, the voltage R1 that distinguishes the "S0" state and the "S1" state and the voltage R5 that distinguishes the "S4" state and the "S5" state. The set including the voltages R1 and R5 used in the P0 read process is also called "read voltage group Vth_0".

A read process of the middle page (P1 read process) uses, as read voltages, the voltage R2 that distinguishes the "S1" state and the "S2" state, the voltage R4 that distinguishes the "S3" state and the "S4" state, and the voltage R6 that distinguishes the "S5" state and the "S6" state. The set including the voltages R2, R4 and R6 used in the P1 read process is also called "read voltage group Vth_1".

A read process of the upper page (P2 read process) uses, as read voltages, the voltage R3 that distinguishes the "S2" state and the "S3" state and the voltage R7 that distinguishes the "S6" state and the "S7" state. The set including the voltages R3 and R7 used in the P2 read process is also called "read voltage group Vth_2".

Note that the memory controller 10 manages the read voltages R1 to R7 that are applied to the read process, by DAC (Digital to Analogue Converter) values representative of shift amounts $\Delta R1$ to $\Delta R7$ from default values, respectively. Hereinafter, the set of shift amounts ($\Delta R1$, $\Delta R5$) corresponding to the read voltage group Vth_0 is also called "shift amount group $\Delta Vth\_0$". The set of shift amounts ($\Delta R2$, $\Delta R4$, $\Delta R6$) corresponding to the read voltage group Vth_1 is also called "shift amount group $\Delta Vth\_1$". The set of shift amounts ($\Delta R3$, $\Delta R7$) corresponding to the read voltage group Vth_2 is also called "shift amount group $\Delta Vth\_2$".

1.1.6 Buffer Memory

Next, the information stored in the buffer memory 12 at the time of the shift amount estimation process is described. FIG. 5 is a view illustrating an example of the information stored in the buffer memory of the memory system according to the first embodiment. FIG. 5 illustrates an example of the information that is stored in the buffer memory 12 at the time of the shift amount estimation process, in the case where data is written in the memory cell transistor MT by the TLC mode.

In the buffer memory 12, areas for storing six pages of data P0_1, P0_2, P1_1, P1_2, P2_1 and P2_2, and three bits of correction statuses STS0, STS1 and STS2, are allocated.

The control circuit 11 regards the data P0_1 as lower page data before the error correction process. The control circuit 11 regards the data P0_2 as lower page data after the error correction process. The correction status STS0 is a bit indicating whether the error correction process for the lower page data is successful. If the correction status STS0 is "1", the control circuit 11 regards the error correction process for the lower page data as being successful. If the correction status STS0 is "0", the control circuit 11 regards the error correction process for the lower page data as failing.

The control circuit 11 regards the data P1_1 as middle page data before the error correction process. The control circuit 11 regards the data P1_2 as middle page data after the error correction process. The correction status STS1 is a bit indicating whether the error correction process for the middle page data is successful. If the correction status STS1 is "1", the control circuit 11 regards the error correction process for the middle page data as being successful. If the correction status STS1 is "0", the control circuit 11 regards the error correction process for the middle page data as failing.

The control circuit 11 regards the data P2_1 as upper page data before the error correction process. The control circuit 11 regards the data P2_2 as upper page data after the error correction process. The correction status STS2 is a bit indicating whether the error correction process for the upper page data is successful. If the correction status STS2 is "1", the control circuit 11 regards the error correction process for the upper page data as being successful. If the correction status STS2 is "0", the control circuit 11 regards the error correction process for the upper page data as failing.

1.2 Operation

Next, an operation in the memory system according to the first embodiment is described.

1.2.1 Read Process Including Shift Amount Estimation Process

Figure 6:
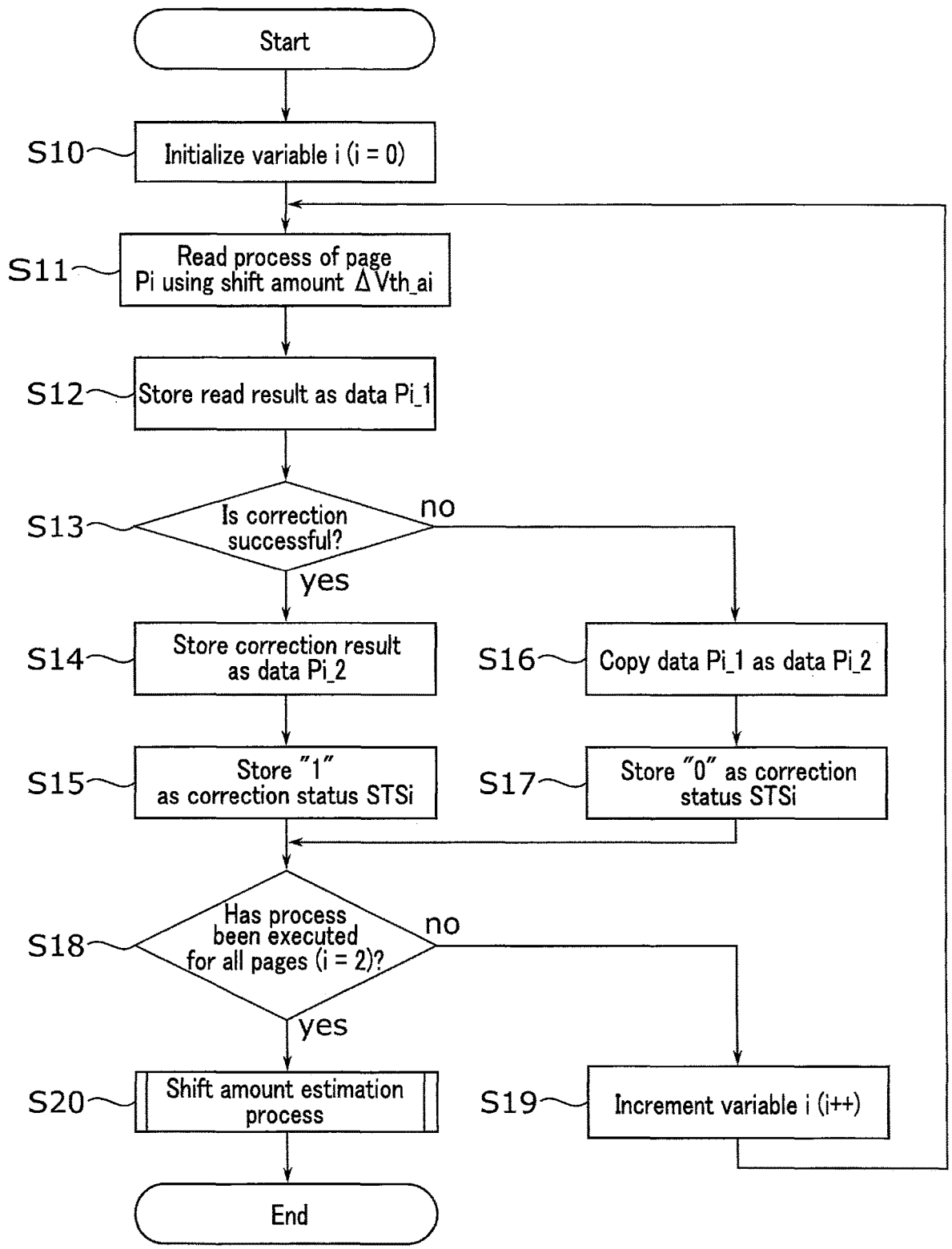
FIG. 6 is a flowchart illustrating an example of a read process including a shift amount estimation process in the memory system according to the first embodiment.

FIG. 6 is a flowchart illustrating an example of a read process including a shift amount estimation process in the memory system according to the first embodiment. FIG. 6 illustrates a case where a read process of all pages is executed for the cell unit CU that is written by the TLC mode.

If a read condition is satisfied (Start), the memory controller 10 initializes a variable i to "0" (S10). The variable i is an integer of 0 or more.

That the read condition is satisfied includes that a start condition of the read process, which the memory controller 10 executes in the internal process, is satisfied. In addition, that the read condition is satisfied may include that the memory controller 10 receives a read request from the host 2.

The internal process includes, for example, a patrol process. In the patrol process, the memory controller 10 reads data from the nonvolatile memory 20 regularly or irregularly. In addition, the memory controller 10 executes an error correction process for the data that was read, and determines whether the number of fail bits included in the read data is equal to or less than an allowable value at which error correction is enabled. If the number of fail bits exceeds the allowable value, the memory controller 10 executes a refresh process for the storage area from which the data was read. The refresh process includes a process of rewriting data. In this manner, by executing the patrol process, the memory controller 10 can keep the number of fail bits included in the data in the nonvolatile memory 20 at the allowable value or less.

After the process of S10, the memory controller causes the nonvolatile memory 20 to execute the read process of a page Pi using a shift amount group $\Delta Vth\_ai$ (S11). The shift amount group $\Delta Vth\_ai$ is a shift amount group $\Delta Vth\_i$ that is applied to the read process before the execution of the shift amount estimation process.

The memory controller 10 causes the buffer memory 12 to store the data read in the process of S11 as data $Pi\_1$ (S12).

The ECC circuit 16 of the memory controller 10 executes the error correction process for the data $Pi\_1$ stored in the process of S12 (S13).

If the error correction process is successful (S13; yes), the memory controller 10 causes the buffer memory 12 to store the corrected data as data $Pi\_2$ (S14).

Then, the memory controller 10 causes the buffer memory 12 to store a bit "1" indicative of the success of the error correction process as a correction status STSi (S15).

If the error correction process fails (S13; no), the memory controller 10 causes the buffer memory 12 to copy the data $Pi\_1$ as data $Pi\_2$ (S16).

Then, the memory controller 10 causes the buffer memory 12 to store a bit "0" indicative of the failure of the error correction process as the correction status STSi (S17).

After the process of S15 or the process of S17, the memory controller 10 determines whether the read process has been executed for all pages (S18). Specifically, in the case of the read process for the cell unit CU that is written by the TLC mode, the memory controller 10 determines whether the variable i is 2.

If there is a page the read process of which has not been executed (S18; no), the memory controller 10 increments the variable i (S19).

After the process of S19, the memory controller causes the nonvolatile memory 20 to execute the read process of a page Pi using a shift amount group $\Delta Vth\_ai$ (S11). Then, the subsequent processes of S12 to S18 are executed. In this manner, until the read process is executed for all pages (i.e., until the data $P0\_1$, $P0\_2$, $P1\_1$, $P1\_2$, $P2\_1$ and $P2\_2$ and the correction statuses STS0, STS1 and STS2 are stored in the buffer memory 12), the processes of S11 to S18 are executed while the variable i is incremented in the process of S19.

If the read process has been executed for all pages (S18; yes), the memory controller 10 executes the shift amount estimation process (S20). The details of the shift amount estimation process will be described later.

If the process of S20 is finished, the read process including the shift amount estimation process ends (End).

1.2.2 First Example of the Shift Amount Estimation Process

A first example of the shift amount estimation process is described.

FIG. 7 is a flowchart illustrating a first example of the shift amount estimation process in the memory system according to the first embodiment. The processes of S21 to S29 illustrated in FIG. 7 correspond to the process of S20 in FIG. 6.

If the shift amount estimation process is started (Start), the memory controller 10 computes a plurality of shift amount groups $\Delta Vth\_p0$, $\Delta Vth\_p1$ and $\Delta Vth\_p2$ by executing a first estimation method using, as inputs, the data $P0\_1$, $P1\_1$, $P2\_1$, $P0\_2$, $P1\_2$ and $P2\_2$ (S21). The first estimation method is an estimation method that can estimate an optimal shift amount group with higher precision than a second estimation method to be described later. In addition, the first estimation method is an estimation method that can estimate an optimal shift amount group in a shorter time than the second estimation method to be described later. The details of the first estimation method will be described later.

After the process of S21, the memory controller initializes the variable i to "0" (S22).

The memory controller 10 determines whether the correction status STSi is "1" (S23).

If the correction status STSi is "1" (S23; yes), the memory controller 10 adopts a shift amount group $\Delta Vth\_pi$, among the shift amount groups $\Delta Vth\_p0$, $\Delta Vth\_p1$ and $\Delta Vth\_p2$ computed in the process of S21 (S24).

If the correction status STSi is "0" (S23; no), the memory controller 10 computes a shift amount group $\Delta Vth\_ti$ by executing the second estimation method using a plurality of read processes (S25). The details of the second estimation method will be described later.

The memory controller 10 adopts the shift amount group $\Delta Vth\_ti$ computed in the process of S25 (S26).

After the process of S24 or the process of S26, the memory controller 10 determines whether the process with the adoption of the shift amount group $\Delta Vth\_i$ has been executed for all pages (S27). Specifically, in the case of the read process for the cell unit CU that is written by the TLC mode, the memory controller 10 determines whether the variable i is 2.

If there is a page for which the process with the adoption of the shift amount group $\Delta Vth\_i$ has not been executed (S27; no), the memory controller 10 increments the variable i (S28).

After the process of S28, the memory controller determines whether the correction status STSi is "1" (S23). Then, the subsequent processes of S24 to S27 are executed. In this manner, until the process with the adoption of the shift amount group $\Delta Vth\_i$ is executed for all pages, the processes of S23 to S27 are executed while the variable i is incremented in the process of S28.

If the process with the adoption of the shift amount group $\Delta Vth\_i$ has been executed for all pages (S27; yes), the memory controller 10 applies the shift amount group $\Delta Vth\_pi$ adopted in the process of S24 and the shift amount group $\Delta Vth\_ti$ adopted in the process of S26 to the subsequent read process (S29).

If the process of S29 is finished, the first example of the shift amount estimation process ends (End).

(First Estimation Method)

In the first estimation method, based on the data P0_1, P1_1 and P2_1, the histogram engine 17 computes, as a histogram H1, the number of memory cell transistors MT belonging to each of the "S0" state to "S7" state in the read data before the error correction process. In addition, based on the data P0_2, P1_2 and P2_2, the histogram engine 17 computes, as a histogram H2, the number of memory cell transistors MT belonging to each of the "S0" state to "S7" state in the read data after the error correction process. Then, based on the computed histogram H1 and histogram H2, the histogram engine 17 computes the numbers of memory cells, $E\_x(x+1)$ and $E\_y(y-1)$ ($0 \le x \le 6$, $1 \le y \le 7$). The number of memory cells, $E\_x(x+1)$, is the number of memory cells, from which data written as an "S(x+1)" state is erroneously read as an "Sx" state. The number of memory cells, $E\_y(y-1)$, is the number of memory cells, from which data written as an "S(y-1)" state is erroneously read as an "Sy" state.

Figure 8:
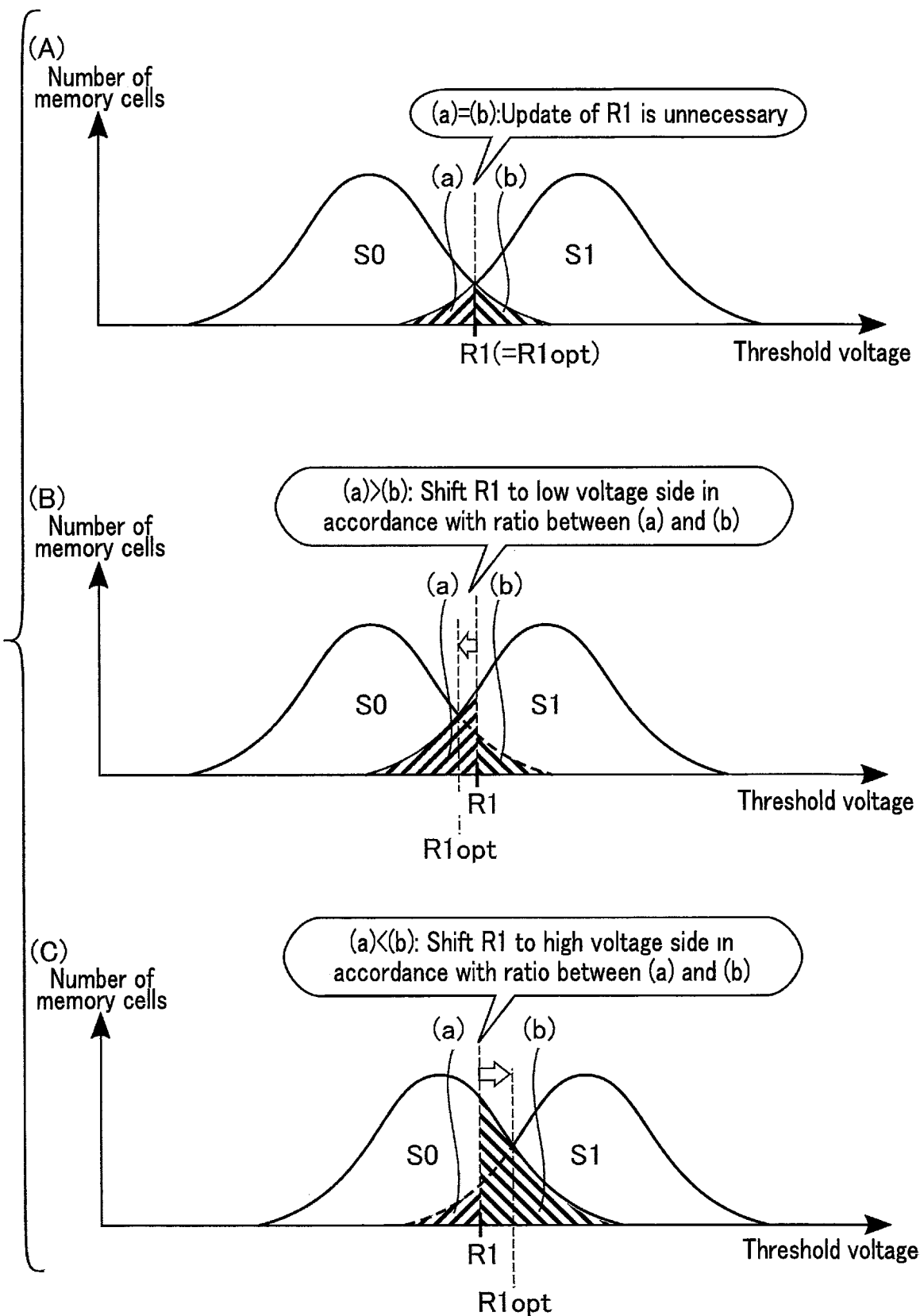
FIG. 8 is a view illustrating an example of a first estimation method applied to the shift amount estimation process in the memory system according to the first embodiment.

Based on the above-described numbers of memory cells $E\_x(x+1)$ and $E\_y(y-1)$, the control circuit 11 computes a plurality of shift amount groups $\Delta Vth\_p0$, $\Delta Vth\_p1$ and $\Delta Vth\_p2$. Referring to FIG. 8, a description is given of a computation method of the shift amount groups $\Delta Vth\_p0$, $\Delta Vth\_p1$ and $\Delta Vth\_p2$ that are based on the numbers of memory cells $E\_x(x+1)$ and $E\_y(y-1)$.

In the example of FIG. 8, a case of computing the shift amount $\Delta R1$ of the read voltage R1 is illustrated. In FIG. 8, the number of memory cells E_01, from which data written as the "S1" state is erroneously read as the "S0" state, corresponds to the area of a region (a) in part (A) of FIG. 8 to part (C) of FIG. 8. Besides, the number of memory cells, E_10, from which data written as the "S0" state is erroneously read as the "S1" state, corresponds to the area of a region (b) in part (A) of FIG. 8 to part (C) of FIG. 8.

Part (A) of FIG. 8 illustrates a case where the read voltage R1 is equal to a threshold voltage R1opt at a position where two threshold voltage distributions corresponding to the "S0" state and "S1" state intersect. In the case of part (A) of FIG. 8, the area of the region (a) and the area of the region (b) are equal. In this case, it is expected that the number E of fail bits (E=E_01+E_10) occurring between the "S0" state and "S1" state becomes minimum. Thus, the memory controller 10 determines that the read voltage R1 requires no update. Specifically, the memory controller 10 computes a shift amount $\Delta R1$ of "0" ($\Delta R1=0$).

Part (B) of FIG. 8 illustrates a case where the read voltage R1 is located more to a high voltage side than the threshold voltage R1opt at the position where the two threshold voltage distributions corresponding to the "S0" state and "S1" state intersect. In the case of part (B) of FIG. 8, the area of the region (a) is greater than the area of the region (b). In this case, the number E of fail bits is greater than the number E of fail bits in the case of part (A) of FIG. 8, and this is not preferable. Thus, the memory controller 10 shifts the read voltage R1 to a low voltage side such that the read voltage R1 becomes closer to the voltage R1opt. Specifically, the memory controller computes a negative shift amount $\Delta R1$ ($\Delta R1<0$).

Part (C) of FIG. 8 illustrates a case where the read voltage R1 is located more to the low voltage side than the threshold voltage R1opt at the position where the two threshold voltage distributions corresponding to the "S0" state and "S1" state intersect. In the case of part (C) of FIG. 8, the area of the region (a) is less than the area of the region (b). In this case, the number E of fail bits is greater than the number E of fail bits in the case of part (A) of FIG. 8, and this is not preferable. Thus, the memory controller 10 shifts the read voltage R1 to the high voltage side such that the read voltage R1 becomes closer to the voltage R1opt. Specifically, the memory controller 10 computes a positive shift amount $\Delta R1$ ($\Delta R1>0$).

Note that it is expected that an absolute value of a difference between the area of the region (a) and the area of the region (b) becomes greater as the read voltage R1 becomes farther from the threshold voltage R1opt. Thus, the memory controller 10 determines the shift amount $\Delta R1$ of the read voltage R1 in accordance with the magnitude of the ratio between the area of the region (a) and the area of the region (b). Thereby, an appropriate shift amount can be determined in accordance with the degree of overlap between the threshold voltage distributions, and the shift amount $\Delta R1$ toward the threshold voltage R1opt can be computed.

Although an illustration is omitted, like the case of the read voltage R1, the shift amounts $\Delta R2$ to $\Delta R7$ are computed for the other read voltages R2 to R7. The set including the shift amounts $\Delta R1$ and $\Delta R5$ corresponds to the shift amount group $\Delta Vth\_p0$. The set including the shift amounts $\Delta R2$, $\Delta R4$ and $\Delta R6$ corresponds to the shift amount group $\Delta Vth\_p1$. The set including the shift amounts $\Delta R3$ and $\Delta R7$ corresponds to the shift amount group $\Delta Vth\_p2$.

By the above operation, in the first estimation method executed in the process of S21, the shift amount groups $\Delta Vth\_p0$, $\Delta Vth\_p1$ and $\Delta Vth\_p2$ are computed based on the data P0_1, P1_1, P2_1, P0_2, P1_2 and P2_2.

Note that the relationship between a pre-estimation shift amount $\Delta R1pre$ and a post-estimation shift amount $\Delta R1post$ is as follows. Specifically, as illustrated in part (A) of FIG. 8, if the area of the region (a) and the area of the region (b) are equal, the update of the shift amount $\Delta R1post$ is unnecessary. Thus, $\Delta R1post=\Delta R1pre$. As illustrated in part (B) of FIG. 8, if the area of the region (a) is greater than the area of the region (b), the shift amount $\Delta R1post$ is updated to a value lower than the shift amount $\Delta R1pre$. As illustrated in part (C) of FIG. 8, if the area of the region (a) is less than the area of the region (b), the shift amount $\Delta R1post$ is updated to a value higher than the shift amount $\Delta R1pre$.

(Second Estimation Method)

In the second estimation method, the memory controller 10 causes the nonvolatile memory 20 to execute a plurality of read processes while shifting the read voltage. In addition, based on a plurality of read data by the read processes, the histogram engine 17 computes, as a histogram H3, the number of memory cell transistors MT in each of threshold voltage ranges (number of interval cells), which are divided by a plurality of read voltages.

Figure 9:
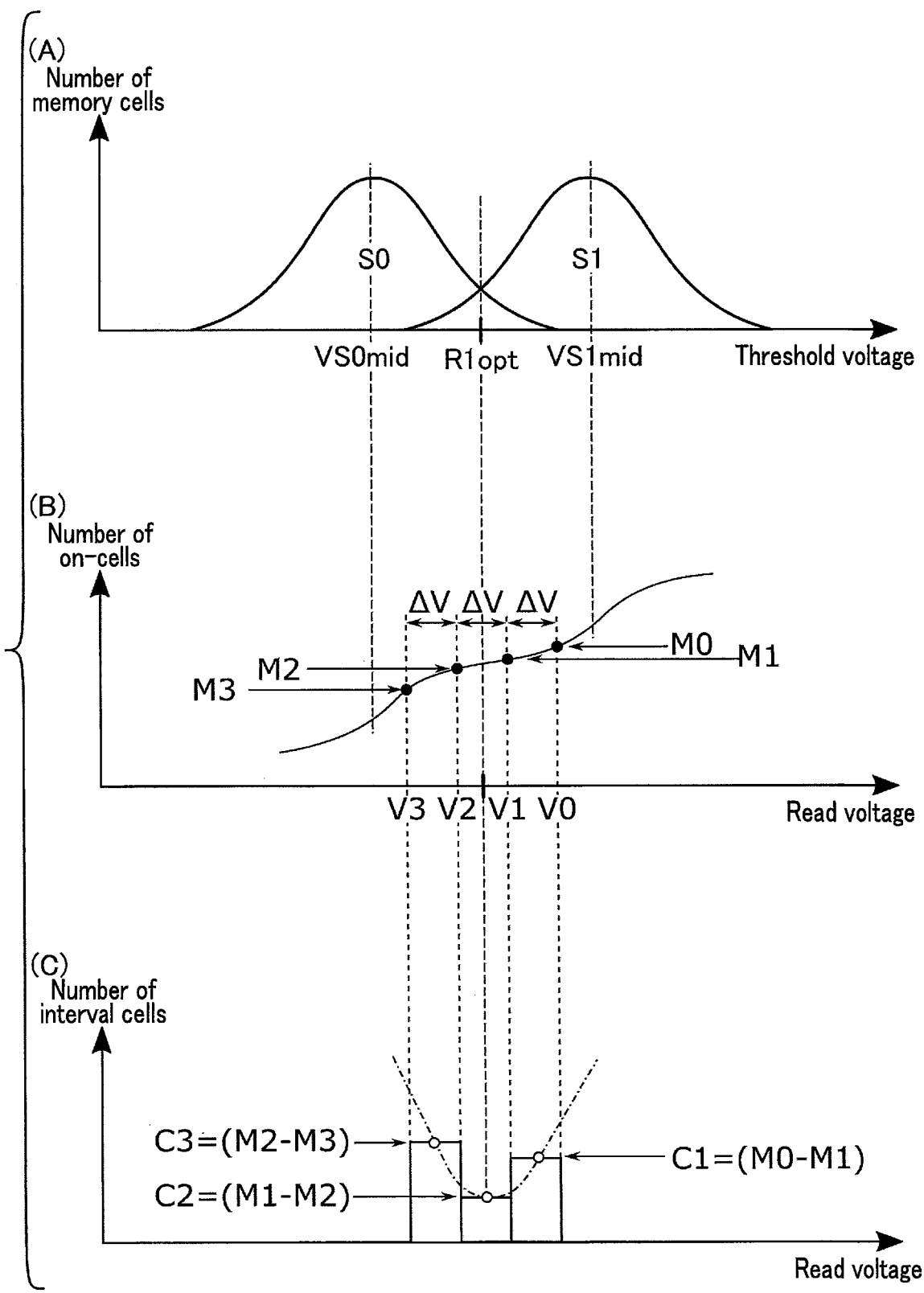
FIG. 9 is a view illustrating an example of a second estimation method applied to the shift amount estimation process in the memory system according to the first embodiment.

Based on the computed histogram H3, the control circuit 11 determines a plurality of read voltage groups $Vth\_t0$, $Vth\_t1$ and $Vth\_t2$. In addition, based on the determined read voltage groups $Vth\_t0$, $Vth\_t1$ and $Vth\_t2$, the control circuit 11 computes a plurality of shift amount groups $\Delta Vth\_t0$, $\Delta Vth\_t1$ and $\Delta Vth\_t2$. Referring to FIG. 9, a description is given of the determination method of the read voltage groups $Vth\_t0$, $Vth\_t1$ and $Vth\_t2$, which are based on the third histogram.

FIG. 9 is a view illustrating an example of the second estimation method applied to the shift amount estimation process in the memory system according to the first embodiment.

Part (A) of FIG. 9 illustrates, by way of example, two threshold voltage distributions corresponding to the "S0" state and "S1" state. Part (B) of FIG. 9 illustrates a transition of the number M of memory cell transistors MT that are in the ON state (the number of on-cells M). Part (C) of FIG. 9 illustrates variation amount of the number of on-cells between two read voltages, i.e., a transition of the number of interval cells C. Part (C) of FIG. 9 corresponds to the above-described third histogram.

As illustrated in part (B) of FIG. 9, if the read voltage V is shifted to the low-voltage side, the number of on-cells M sharply decreases at a voltage that is slightly higher than a voltage VS1mid that is a mode value of the "S1" state, and |dM/dV| becomes maximum. Here, the mode value is a voltage at which the distribution probability of the threshold voltage becomes maximum in part (A) of FIG. 9. If the read voltage V is further decreased, the rate of decrease of the number of on-cells M decreases, and the rate of decrease of the number of on-cells M becomes minimum at the read voltage V of a certain value. The minimum value of the rate of decrease of the number of on-cells M becomes zero in the case where the threshold voltage distribution belonging to the "S1" state does not overlap the threshold voltage distribution belonging to the "S0" state. On the other hand, in the case where the threshold voltage distribution belonging to the "S1" state overlaps the threshold voltage distribution belonging to the "S0" state, the minimum value of the rate of decrease of the number of on-cells M becomes a value that is not zero (>0). If the read voltage V is further decreased, the rate of decrease of the number on-cells M increases once again, and |dM/dV| becomes maximum once again at a voltage that is slightly higher than a voltage VS0mid that is a mode value of the "S0" state.

By the above-described variation of the number of on-cells M, the read voltage V at which the overlap between the threshold voltage distributions of the two states becomes minimum (i.e., the read voltage V corresponding to the intersection between the threshold voltage distributions of the two states) can be detected. For example, a read process is first executed by using a read voltage V0. The number of on-cells at this time is assumed to be M0. Next, a read process is executed by using a voltage V1 that is lower than the voltage V0 by ΔV. The number of on-cells at this time is assumed to be M1. Then, the number of memory cell transistors MT, which newly enter the OFF state when the read voltage decreases from V0 to V1, is C1=M0−M1. In other words, the number of interval cells between the threshold voltages of [V0, V1] is C1.

Subsequently, a read process is executed by using a voltage V2 that is lower than the voltage V1 by ΔV. The number of on-cells at this time is assumed to be M2. Then, the number of memory cell transistors MT, which newly enter the OFF state when the read voltage decreases from V1 to V2, is C2=M1−M2. In other words, the number of interval cells between the threshold voltages of [V1, V2] is C2. In addition, if C1>C2, it is considered that the voltage, at which |dM/dV| becomes minimum, is located, at least, more to the low voltage side than the voltage V1.

Following the above, a read process is executed by using a voltage V3 that is lower than the voltage V2 by ΔV. The number of on-cells at this time is assumed to be M3. Then, the number of memory cell transistors MT, which newly enter the OFF state when the read voltage decreases from V2 to V3, is C3=M2−M3. In other words, the number of interval cells between the threshold voltages of [V2, V3] is C3. Here, if C3>C2, a histogram as illustrated in part (C) of FIG. 9 is obtained as the third histogram.

As a result of the above, by the number of interval cells C, a threshold voltage distribution as illustrated by a dot-and-dash line in part (C) of FIG. 9 can be estimated. In addition, it can be estimated that the read voltage, at which the overlap between the threshold voltage distribution belonging to the "S0" state and the threshold voltage distribution belonging to the "S1" state becomes minimum, is present between the voltage V1 and the voltage V2 (i.e., in the section in which the number of interval cells is a minimum value).

By the above operation, in the second estimation method executed in the process of S25, the read voltage group Vth_ti is determined based on the plural read processes.

Note that in a case where a read process of a certain page (page read process) is applied to each of a plurality of read processes, there is a case in which respective read data are associated with a plurality of nonsuccessive voltage ranges. Concretely, for example, the bit "1" in the lower page data is associated with the voltage range of the read voltage R1 or less, and the voltage range of the read voltage R5 or more. Thus, there is a case where it is difficult to correctly compute the number of on-cells by only a plurality of lower page data by a plurality of P0 read processes that are executed while shifting the read voltage.

Thus, in the case where the page read process is applied to each of the plural read processes, the memory controller 10 causes the nonvolatile memory 20 to further execute at least one single-state read process, in addition to the plural read processes. In the single-state read process, read data is generated based on one read voltage, and, in this respect, the single-state read process differs from the page read process that generates read data, based on two or more read voltages. In the single-state read process, a voltage located between nonsuccessive voltage ranges associated with page data is applied. Concretely, for example, for the P0 read process, a single-state read process of the read voltage R3 may be executed. For the P1 read process, a single-state read process of the read voltage R3 and a single-state read process of the read voltage R5 may be executed. For the P2 read process, a single-state read process of the read voltage R5 may be executed. Thereby, the number of on-cells can correctly be computed.

1.2.3 Second Example of the Shift Amount Estimation Process

Next, a second example of the shift amount estimation process is described.

FIG. 10 is a flowchart illustrating a second example of the shift amount estimation process in the memory system according to the first embodiment. The processes of S31 to S39 illustrated in FIG. 10 correspond to the process of S20 in FIG. 6.

If the shift amount estimation process is started (Start), the memory controller 10 computes a plurality of shift amount groups ΔVth_p0, ΔVth_p1 and ΔVth_p2 by executing a first estimation method using, as inputs, the data P0_1, P1_1, P2_1, P0_2, P1_2 and P2_2 (S31). The first estimation method is an estimation method that can estimate an optimal shift amount group with higher precision than a third estimation method to be described later.

The memory controller 10 computes a plurality of shift amount groups ΔVth_v0, ΔVth_v1 and ΔVth_v2 by executing a third estimation method using the data P0_1, P1_1 and P2_1 and a plurality of shift amount groups ΔVth_a0, ΔVth_a1 and ΔVth_a2 (S32).

After the process of S32, the memory controller 10 initializes the variable i to 0 (S33).

The memory controller 10 determines whether the correction status STSi is "1" (S34).

If the correction status STSi is "1" (S34; yes), the memory controller 10 adopts a shift amount group ΔVth_pi, among the shift amount groups ΔVth_p0, ΔVth_p1 and ΔVth_p2 computed in the process of S31 (S35).

If the correction status STSi is "0" (S34; no), the memory controller 10 adopts a shift amount group ΔVth_vi, among the shift amount groups ΔVth_v0, ΔVth_v1 and ΔVth_v2 computed in the process of S32 (S36).

After the process of S35 or the process of S36, the memory controller 10 determines whether the process with the adoption of the shift amount group ΔVth_i has been executed for all pages (S37). Specifically, in the case of the read process for the cell unit CU that is written by the TLC mode, the memory controller 10 determines whether the variable i is 2.

If there is a page for which the process with the adoption of the shift amount group ΔVth_i has not been executed (S37; no), the memory controller 10 increments the variable i (S38).

After the process of S38, the memory controller 10 determines whether the correction status STSi is "1" (S34). Then, the subsequent processes of S35 to S37 are executed. In this manner, until the process with the adoption of the shift amount group ΔVth_i is executed for all pages, the processes of S34 to S37 are executed while the variable i is incremented in the process of S38.

If the process with the adoption of the shift amount group ΔVth_i has been executed for all pages (S37; yes), the memory controller 10 applies the shift amount group ΔVth_pi adopted in the process of S35 and the shift amount group ΔVth_vi adopted in the process of S36 to the subsequent read process (S39).

If the process of S39 is finished, the second example of the shift amount estimation process ends (End).

(Third Estimation Method)

FIG. 11 is a view illustrating an example of a third estimation method applied to the shift amount estimation process in the memory system according to the first embodiment.

In the third estimation process, the histogram engine 17 computes, as a histogram H1, the number of memory cell transistors MT belonging to each of the "S0" state to "S7" state in the read data before the error correction process, based on the data P0_1, P1_1 and P2_1. Then, the control circuit 11 computes a plurality of shift amount groups ΔVth_v0, ΔVth_v1 and ΔVth_v2, based on the histogram H1 and a plurality of shift amount groups ΔVth_a0, ΔVth_a1 and ΔVth_a2 applied to the read process of the data P0_1, P1_1 and P2_1. Note that it suffices that the shift amount groups ΔVth_a0, ΔVth_a1 and ΔVth_a2 used as the input of the third estimation method are shift amount groups applied to the read process of the data P0_1, P1_1 and P2_1, respectively, and freely selected values can be applied thereto.

The control circuit 11 may compute the shift amount groups ΔVth_v0, ΔVth_v1 and ΔVth_v2 by inputting the histogram H1 and the shift amount groups ΔVth_a0, ΔVth_a1 and ΔVth_a2 to a predetermined linear matrix. The control circuit 11 may compute the shift amount groups ΔVth_v0, ΔVth_v1 and ΔVth_v2 by inputting the histogram H1 and the shift amount groups ΔVth_a0, ΔVth_a1 and ΔVth_a2 to a pre-trained neural network.

Besides, the control circuit 11 may further compute reliabilities r_v1, r_v2, r_v3, r_v4, r_v5, r_v6 and r_v7, together with the shift amount groups ΔVth_v0, ΔVth_v1 and ΔVth_v2. The reliability, r_v1 to r_v7, indicates the likelihood (estimation precision) of the shift amount computed by the third estimation method. Each of the reliabilities r_v1 to r_v7 is a real number of 0 or more and 1 or less. The reliabilities r_v1 and r_v5 correspond to the shift amounts ΔR1 and ΔR5 in the shift amount group ΔVth_v0. The reliabilities r_v2, r_v4 and r_v6 correspond to the shift amounts ΔR2, ΔR4 and ΔR6 in the shift amount group ΔVth_v1. The reliabilities r_v3 and r_v7 correspond to the shift amounts ΔR3 and ΔR7 in the shift amount group ΔVth_v2.

Note that the control circuit 11 may not compute the reliabilities r_v1 to r_v7, together with the shift amount groups ΔVth_v0, ΔVth_v1 and ΔVth_v2. In the case where the reliabilities r_v1 to r_v7 are not computed together with the shift amount groups ΔVth_v0, ΔVth_v1 and ΔVth_v2, the memory controller 10 may prestore the reliabilities r_v1 to r_v7 as fixed values.

1.3 Advantageous Effects According to the First Embodiment

According to the first embodiment, in the read process from a certain cell unit CU, if there are a page that was successful in the error correction process and a page that failed in the error correction process, the memory controller 10 estimates read voltages by applying different estimation methods to the successful page and the failed page in the error correction process. Specifically, in the shift amount estimation process, the memory controller 10 applies the first estimation method to the successful page in the error correction process, and applies the second estimation method or third estimation method to the failed page in the error correction process. Thereby, compared to the case where the second estimation method or third estimation method is applied to all pages when even one page failed in the error correction process, the first estimation method can be applied to a greater number of pages. Thus, optimal read voltages can be computed with high precision for a greater number of pages.

In the first example of the shift amount estimation process, the memory controller 10 applies the first estimation method to the page that was successful in the error correction process, and applies the second estimation method to the page that failed in the error correction process. In the second estimation method, the memory controller 10 causes the nonvolatile memory 20 to execute a plurality of read processes while shifting the read voltage. Thereby, the number of times of application of the second estimation method can be reduced, compared to the case of applying the second estimation method to all pages when even one page failed in the error correction process. Thus, the number of times of read processes executed in the second estimation method can be reduced, and the time needed for the shift amount estimation process can be shortened. Therefore, an increase in the load on the memory system 3 by the shift amount estimation process can be suppressed.

In the second example of the shift amount estimation process, the memory controller 10 applies the first estimation method to the page that was successful in the error correction process, and applies the third estimation method to the page that failed in the error correction process. In the third estimation method, the memory controller 10 computes the shift amount groups ΔVth_v0, ΔVth_v1 and ΔVth_v2 by using the shift amount groups ΔVth_a0, ΔVth_a1 and ΔVth_a2 in addition to the data P0_1, P1_1 and P2_1. Thereby, the shift amount groups ΔVth_v0, ΔVth_v1 and ΔVth_v2 can be estimated with higher precision than in the estimation method that estimates the shift amount groups by using, as the input, the data P0_1, P1_1 and P2_1, without using the shift amount groups ΔVth_a0, ΔVth_a1 and ΔVth_a2.

Furthermore, the shift amount groups ΔVth_a0, ΔVth_a1 and ΔVth_a2 used as the input of the third estimation method are not limited to fixed values, and freely selected values can be applied thereto. Thereby, the general-purpose properties of the third estimation method can be enhanced, compared to the case where values other than fixed values cannot be applied.

2. Second Embodiment

Next, a memory system according to a second embodiment is described. The second embodiment differs from the first embodiment in that the shift amount groups computed by the first estimation method are utilized for computing a shift amount group corresponding to a page to which the first estimation method cannot be applied. In the description below, a description of the same configurations and operations as in the first embodiment is omitted, and different configurations and operations than in the first embodiment are mainly described.

2.1 Nonvolatile Memory

FIG. 12 is a block diagram illustrating an example of the configuration of an information processing system according to a second embodiment. FIG. 12 corresponds to FIG. 1 in the first embodiment. The configurations of the host 2, memory controller 10 and nonvolatile memory 20 are the same as in the case of FIG. 1. The volatile memory 30 stores reliability information 31 and a correction DB 32.

The reliability information 31 stores, as reliability, the likelihood (estimation precision) of a shift amount of an estimation destination in a case where the shift amount of the estimation destination is estimated based on a shift amount of an estimation source. The reliability stored in the reliability information 31 is, for example, a value indicative of a correlation between the shift amount of the estimation source and the shift amount of the estimation destination.

Figures 13, 14:
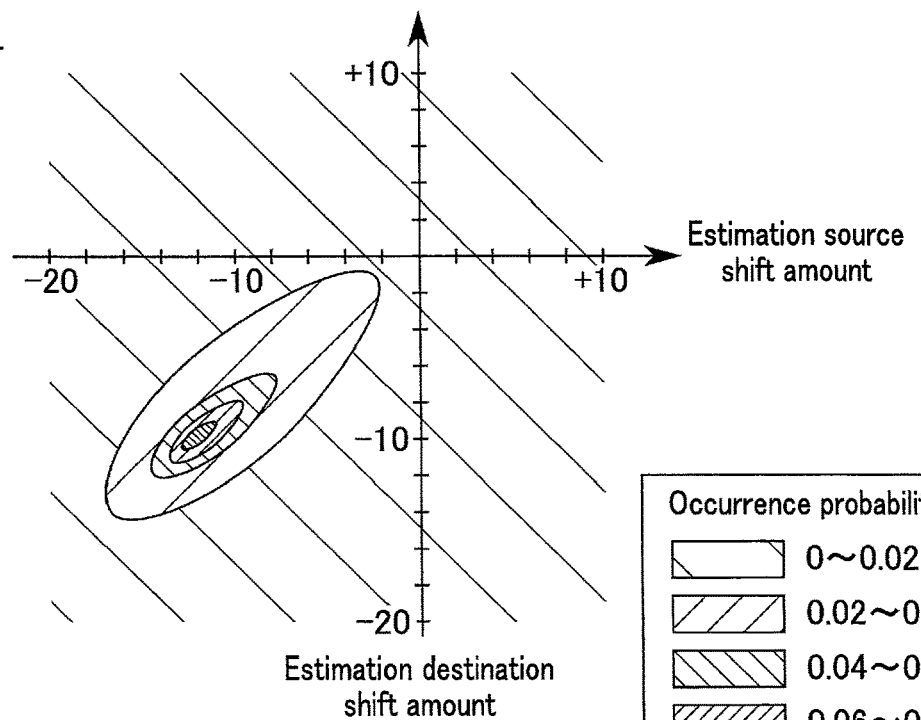
FIG. 13 is a view illustrating an example of reliability information of a memory system according to the second embodiment.
FIG. 14 is a view illustrating an example of a correction DB of the memory system according to the second embodiment.

FIG. 13 is a view illustrating an example of the reliability information according to the second embodiment. In the example of FIG. 13, a case is illustrated in which the reliability in the case of estimating the shift amount ΔR2, based on the shift amount ΔR1, is expressed as r21. Similarly, the reliability in the case of estimating a shift amount ΔRq, based on a shift amount ΔR1p, is expressed as rqp. Here, the reliability rqp is a real number of 0 or more and 1 or less. Each of p and q is an integer of 1 or more and 7 or less.

Hereinafter, it is assumed that a set {r21, r31, r41, r51, r61, r71, r15, r25, r35, r45, r65, r75} of reliabilities, the estimation sources of which are the shift amounts ΔR1 and ΔR5 of the lower page P0, is E0. It is assumed that a set {r12, r32, r42, r52, r62, r72, r14, r24, r34, r54, r64, r74, r16, r26, r36, r46, r56, r76} of reliabilities, the estimation sources of which are the shift amounts ΔR2, ΔR4 and ΔR6 of the middle page P1, is E1. It is assumed that a set {r13, r23, r43, r53, r63, r73, r17, r27, r37, r47, r57, r67} of reliabilities, the estimation sources of which are the shift amounts ΔR3 and ΔR7 of the upper page P2, is E2. Note that since each of the reliabilities r11, r22, r33, r44, r55, r66 and r77 is "1", it is assumed that these are not included in the above-described sets E0, E1 and E2.

In addition, it is assumed that a set of reliabilities, the estimation destination of which is the shift amount ΔR1, is F1. It is assumed that a set of reliabilities, the estimation destination of which is the shift amount ΔR2, is F2. It is assumed that a set of reliabilities, the estimation destination of which is the shift amount ΔR3, is F3. It is assumed that a set of reliabilities, the estimation destination of which is the shift amount ΔR4, is F4. It is assumed that a set of reliabilities, the estimation destination of which is the shift amount ΔR5, is F5. It is assumed that a set of reliabilities, the estimation destination of which is the shift amount ΔR6, is F6. It is assumed that a set of reliabilities, the estimation destination of which is the shift amount ΔR7, is F7.

The correction DB 32 stores information in which a shift amount of an estimation destination with a highest likelihood is obtained as an output in relation to an input of a shift amount of an estimation source.

FIG. 14 is a view illustrating an example of the correction DB according to the second embodiment. The example of FIG. 14 illustrates a case where an occurrence probability distribution in the combination of two shift amounts is stored as the correction DB 32. In FIG. 14, if one of the set of two shift amounts is a shift amount of the estimation source and the other is a shift amount of the estimation destination, a shift amount with a highest occurrence probability in the combination with the shift amount of the estimation source is computed as the shift amount of the estimation destination.

2.2 Third Example of the Shift Amount Estimation Process

A third example of the shift amount estimation process is described.

FIG. 15 is a flowchart illustrating a third example of the shift amount estimation process in the memory system according to the second embodiment. The processes of S41 to S52 illustrated in FIG. 15 correspond to the process of S20 in FIG. 6.

If the shift amount estimation process is started (Start), the memory controller 10 determines whether all the correction statuses STS0, STS1 and STS2 are "0" (S41).

If at least one of the correction statuses STS0, STS1 and STS2 is "1" (S41; no), the memory controller 10 computes a plurality of shift amount groups ΔVth_p0, ΔVth_p1 and ΔVth_p2 by executing the first estimation method using, as inputs, the data P0_1, P1_1, P2_1, P0_2, P1_2 and P2_2 (S42). The first estimation method is an estimation method that can estimate an optimal shift amount group with higher precision than a fourth estimation method to be described later.

After the process of S42, the memory controller 10 initializes the variable i to 0 (S43).

After the process of S43, the memory controller 10 determines whether the correction status STSi is "1" (S44).

If the correction status STSi is "1" (S44; yes), the memory controller 10 adopts a shift amount group ΔVth_pi, among the shift amount groups ΔVth_p0, ΔVth_p1 and ΔVth_p2 computed in the process of S42 (S45).

If the correction status STSi is "0" (S44; no), the memory controller 10 computes a shift amount group ΔVth_ci by executing a fourth estimation method using the reliability information 31 (S46). The details of the fourth estimation method will be described later.

The memory controller 10 adopts the shift amount group ΔVth_ci computed in the process of S46 (S47).

After the process of S45 or the process of S47, the memory controller 10 determines whether the process with the adoption of the shift amount group ΔVth_i has been executed for all pages (S48). Specifically, in the case of the read process for the cell unit CU that is written by the TLC mode, the memory controller 10 determines whether the variable i is 2.

If there is a page for which the process with the adoption of the shift amount group ΔVth_i has not been executed (S48; no), the memory controller 10 increments the variable i (S49).

After the process of S49, the memory controller determines whether the correction status STSi is "1" (S44). Then, the subsequent processes of S45 to S48 are executed. In this manner, until the process with the adoption of the shift amount group ΔVth_i is executed for all pages, the processes of S44 to S48 are executed while the variable i is incremented in the process of S49.

If the process with the adoption of the shift amount group ΔVth_i has been executed for all pages (S48; yes), the memory controller 10 applies the shift amount group ΔVth_pi adopted in the process of S45 and the shift amount group ΔVth_ci adopted in the process of S47 to the subsequent read process (S50).

If all the correction statuses STS0, STS1 and STS2 are "0" (S41; yes), the memory controller 10 computes a plurality of shift amount groups ΔVth_t0, ΔVth_t1 and ΔVth_t2 by executing the second estimation method using a plurality of read processes (S51).

The memory controller 10 adopts the shift amount groups ΔVth_t0, ΔVth_t1 and ΔVth_t2 computed in the process of S51 (S52).

After the process of S52, the memory controller applies the shift amount groups ΔVth_t0, ΔVth_t1 and ΔVth_t2 adopted in the process of S52 to the subsequent read process (S50).

If the process of S50 is finished, the third example of the shift amount estimation process ends (End).

(Fourth Estimation Method)

Figure 16:
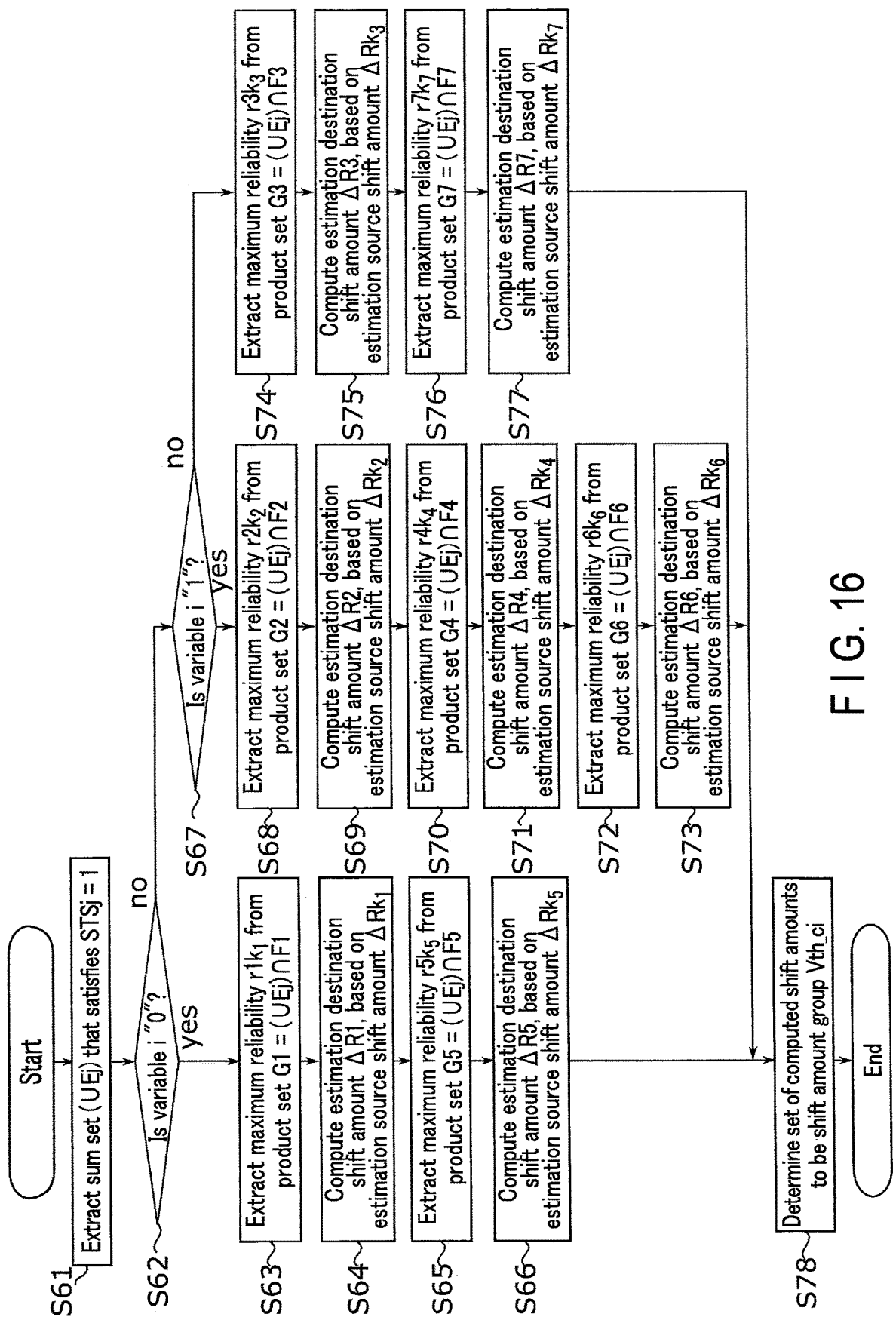
FIG. 16 is a flowchart illustrating an example of a fourth estimation method applied to the shift amount estimation process in the memory system according to the second embodiment.

FIG. 16 is a flowchart illustrating an example of a fourth estimation method applied to the shift amount estimation process in the memory system according to the second embodiment. FIG. 16 corresponds to the process of S46 in FIG. 15.

If the fourth estimation method is started (Start), the memory controller 10 refers to the reliability information 31 and extracts a sum set ($\cup$ Ej) that satisfies a correction status STSj=1 (S61). In the case where the TLC mode is applied, the variable i is an integer of 0 or more and 2 or less.

The memory controller 10 determines whether the variable i is "0" (S62). Specifically, the memory controller 10 determines whether the shift amount group of the estimation destination corresponds to the lower page P0.

If the variable i is "0" (S62; yes), the memory controller 10 refers to the reliability information 31, and extracts a maximum value of reliability (maximum reliability $r1k_1$) from a product set G1 (=($\cup$ Ej)$\cap$ F1) (S63). Here, $k_1$ is an integer of 1 or more and 7 or less.

The memory controller 10 refers to the correction DB32, and computes a shift amount ΔR1 of the estimation destination, based on a shift amount $\Delta Rk_1$ of the estimation source corresponding to the maximum reliability $r1k_1$ extracted in the process of S63 (S64).

Subsequently, the memory controller 10 refers to the reliability information 31, and extracts a maximum value of reliability (maximum reliability $r1k_5$) from a product set G5 (=($\cup$ Ej)$\cap$ F5) (S65). Here, $k_5$ is an integer of 1 or more and 7 or less.

The memory controller 10 refers to the correction DB32, and computes a shift amount ΔR5 of the estimation destination, based on a shift amount $\Delta Rk_5$ of the estimation source corresponding to the maximum reliability $r5k_5$ extracted in the process of S65 (S66).

If the variable i is not "0" (S62; no), the memory controller 10 determines whether the variable i is "1" (S67). Specifically, the memory controller 10 determines whether the shift amount group of the estimation destination corresponds to the middle page P1.

If the variable i is "1" (S67; yes), the memory controller 10 refers to the reliability information 31, and extracts a maximum value of reliability (maximum reliability $r2k_2$) from a product set G2 (=($\cup$ Ej)$\cap$ F2) (S68). Here, $k_2$ is an integer of 1 or more and 7 or less.

The memory controller 10 refers to the correction DB32, and computes a shift amount ΔR2 of the estimation destination, based on a shift amount $\Delta Rk_2$ of the estimation source corresponding to the maximum reliability $r2k_2$ extracted in the process of S68 (S69).

Subsequently, the memory controller 10 refers to the reliability information 31, and extracts a maximum value of reliability (maximum reliability $r4k_4$) from a product set G4 (=($\cup$ Ej)$\cap$ F4) (S70). Here, $k_4$ is an integer of 1 or more and 7 or less.

The memory controller 10 refers to the correction DB32, and computes a shift amount ΔR4 of the estimation destination, based on a shift amount $\Delta Rk_4$ of the estimation source corresponding to the maximum reliability $r4k_4$ extracted in the process of S70 (S71).

Subsequently, the memory controller 10 refers to the reliability information 31, and extracts a maximum value of reliability (maximum reliability $r6k_6$) from a product set G6 (=($\cup$ Ej)$\cap$ F6) (S72). Here, $k_6$ is an integer of 1 or more and 7 or less.

The memory controller 10 refers to the correction DB32, and computes a shift amount ΔR6 of the estimation destination, based on a shift amount $\Delta Rk_6$ of the estimation source corresponding to the maximum reliability $r6k_6$ extracted in the process of S72 (S73).

If the variable i is not "1" (S67; no), the memory controller 10 determines that the shift amount group of the estimation destination corresponds to the upper page P2. Then, the memory controller 10 refers to the reliability information 31, and extracts a maximum value of reliability (maximum reliability $r3k_3$) from a product set G3 (=($\cup$ Ej) $\cap$ F3) (S74). Here, $k_3$ is an integer of 1 or more and 7 or less.

The memory controller 10 refers to the correction DB32, and computes a shift amount ΔR3 of the estimation destination, based on a shift amount $\Delta Rk_3$ of the estimation source corresponding to the maximum reliability $r3k_3$ extracted in the process of S74 (S75).

Subsequently, the memory controller 10 refers to the reliability information 31, and extracts a maximum value of reliability (maximum reliability $r7k_7$) from a product set G7 (=($\cup$ Ej)$\cap$ F7) (S76). Here, $k_7$ is an integer of 1 or more and 7 or less.

The memory controller 10 refers to the correction DB32, and computes a shift amount ΔR7 of the estimation destination, based on a shift amount $\Delta Rk_7$ of the estimation source corresponding to the maximum reliability $r7k_7$ extracted in the process of S76 (S77).

After the processes of S64 and S66, after the processes of S69, S71 and S73, or after the processes of S75 and S77, the memory controller 10 determines the set of computed shift amounts to be the shift amount group Vth_ci (S78).

If the process of S78 is finished, the fourth estimation method ends (End).

Figure 17:
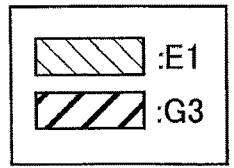
FIG. 17 is a view illustrating an example of the fourth estimation method applied to the shift amount estimation process in the memory system according to the second embodiment.
Figure 18:
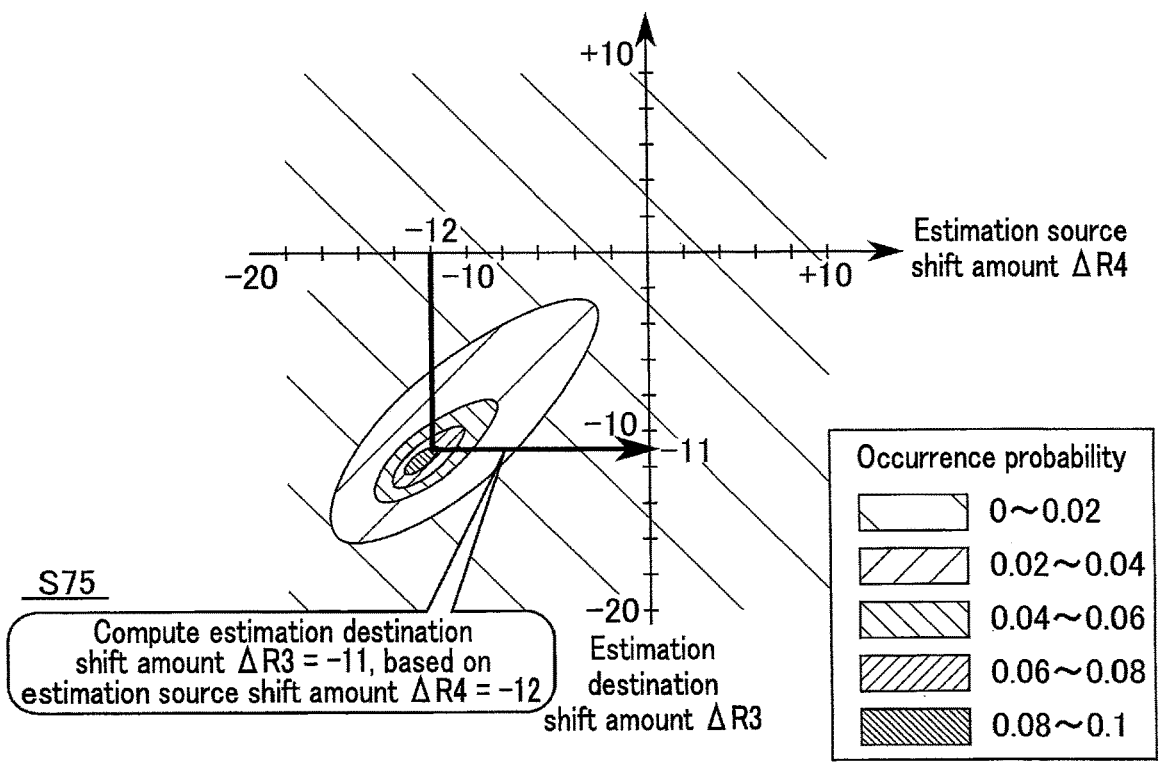
FIG. 18 is a view illustrating an example of the fourth estimation method applied to the shift amount estimation process in the memory system according to the second embodiment.

FIG. 17 and FIG. 18 are views illustrating examples of the fourth estimation method applied to the shift amount estimation process in the memory system according to the second embodiment. In FIG. 17, the processes of S61 and S74 in FIG. 16 are illustrated based on FIG. 13. In FIG. 18, the process of S75 in FIG. 16 is illustrated based on FIG. 14. To be more specific, FIG. 17 illustrates a case of $k_3=4$, as an example of the case of estimating the estimation destination shift amount $\Delta R3$ in a case where i=2, STS0=0, STS1=1, and STS2=0. FIG. 18 illustrates a case of $\Delta R4=-12$, as an example of the case of estimating the estimation destination shift amount $\Delta R3$ from the estimation source shift amount $\Delta R4$.

As illustrated in FIG. 17, the memory controller 10 extracts the set E1 as the sum set ($\cup$ Ej), since the error correction process of the lower page P0 failed and the error correction process of the middle page P1 was successful at the time of computing a shift amount group $\Delta Vth\_c2$ of the upper page P2.

The memory controller 10 extracts, as a product set G3, a product set G3={r32, r34, r36} between the set E1 and set F3. Then, the memory controller 10 extracts r34 as the maximum reliability $r3k_3$ from the product set G3 (S74). Thereby, the memory controller 10 determines the shift amount $\Delta R4$ corresponding to the maximum reliability r34 to be the estimation source shift amount for the estimation destination shift amount $\Delta R3$.

As illustrated in FIG. 18, the memory controller refers to the correction DB 32 relating to the set including the shift amounts $\Delta R3$ and $\Delta R4$, and computes an estimation destination shift amount at which the occurrence probability becomes maximum in the case where $\Delta R4=-12$ (S75). Thereby, the memory controller 10 can compute the estimation destination shift amount $\Delta R3=-11$.

2.3 Fourth Example of the Shift Amount Estimation Process

Next, a fourth example of the shift amount estimation process is described.

FIG. 19 is a flowchart illustrating a fourth example of the shift amount estimation process in the memory system according to the second embodiment. The processes of S41 to S50, S53, and S54 correspond to the process of S20 in FIG. 6. Note that since the processes of S41 to S49 in FIG. 19, and the process of S50 following the process of S48, are the same as in the case of FIG. 15, a description thereof is omitted.

If all the correction statuses STS0, STS1 and STS2 are "0" (S41; yes), the memory controller 10 computes a plurality of shift amount groups $\Delta Vth\_v0$, $\Delta Vth\_v1$ and $\Delta Vth\_v2$ by executing the third estimation method using the data P0_1, P1_1 and P2_1 and the shift amount groups $\Delta Vth\_a0$, $\Delta Vth\_a1$ and $\Delta Vth\_a2$ (S53).

The memory controller 10 adopts the shift amount groups $\Delta Vth\_v0$, $\Delta Vth\_v1$ and $\Delta Vth\_v2$ computed in the process of S53 (S54).

After the process of S54, the memory controller 10 applies the shift amount groups $\Delta Vth\_v0$, $\Delta Vth\_v1$ and $\Delta Vth\_v2$ adopted in the process of S54 to the subsequent read process (S50).

If the process of S50 is finished, the fourth example of the shift amount estimation process ends (End).

2.4 Advantageous Effects According to the Second Embodiment

According to the second embodiment, in the third example of the shift amount estimation process, the memory controller 10 applies, in the shift amount estimation process, the first estimation method to the page that was successful in the error correction process and applies the fourth estimation method to the page that failed in the error correction process. In the fourth estimation method, the memory controller 10 computes the shift amount of the page that failed in the error correction process, based on the shift amount with the highest reliability, among the shift amount groups of the other pages computed in the first estimation method. Thereby, the shift amount with a high correlation with the shift amount of the estimation destination can be utilized as the shift amount of the estimation source. Therefore, the shift amount can be computed with higher efficiency and precision.

3. Third Embodiment

Next, a memory system according to a third embodiment is described. The third embodiment differs from the second embodiment in that, based on the highness/lowness of the reliability, it is determined whether the shift amount groups computed by the first estimation method are utilized for the computation of the shift amount group corresponding to the page to which the first estimation method cannot be applied. In the description below, a description of the same configurations and operations as in the second embodiment is omitted, and different configurations and operations than in the second embodiment are mainly described.

3.1 Fifth Example of the Shift Amount Estimation Process

Figure 20:
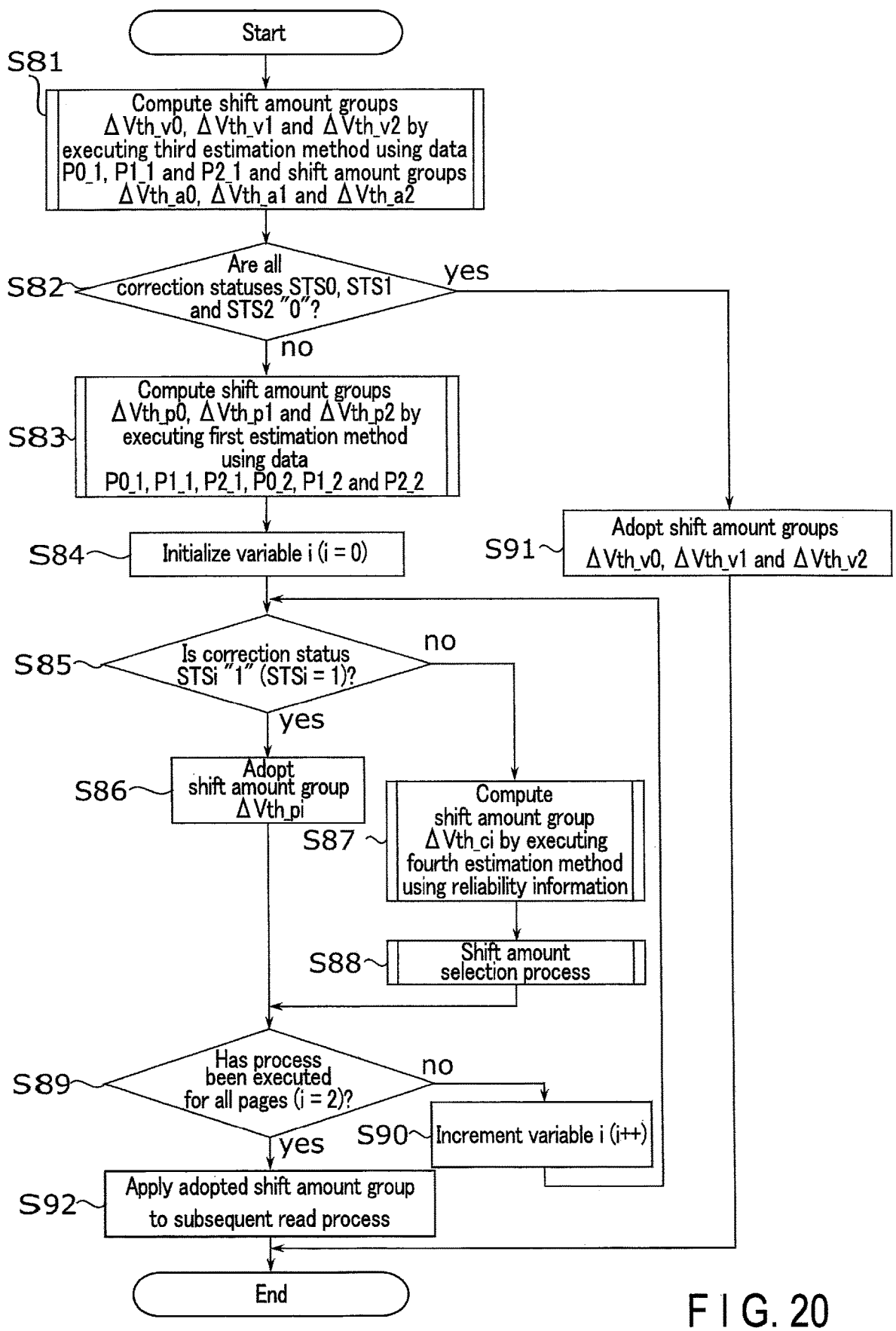
FIG. 20 is a flowchart illustrating an example of a shift amount estimation process in a memory system according to a third embodiment.

FIG. 20 is a flowchart illustrating a fifth example of the shift amount estimation process in the memory system according to the third embodiment. FIG. 20 corresponds to the process of S20 in FIG. 6.

If the shift amount estimation process is started (Start), the memory controller 10 computes a plurality of shift amount groups $\Delta Vth\_v0$, $\Delta Vth\_v1$ and $\Delta Vth\_v2$ by executing the third estimation method using the data P0_1, P1_1 and P2_1 and a plurality of shift amount groups $\Delta Vth\_a0$, $\Delta Vth\_a1$ and $\Delta Vth\_a2$ (S81).

After the process of S81, the memory controller 10 determines whether all the correction statuses STS0, STS1 and STS2 are "0" (S82).

If at least one of the correction statuses STS0, STS1 and STS2 is "1" (S82; no), the memory controller 10 computes a plurality of shift amount groups $\Delta Vth\_p0$, $\Delta Vth\_p1$ and $\Delta Vth\_p2$ by executing the first estimation method using, as inputs, the data P0_1, P1_1, P2_1, P0_2, P1_2 and P2_2 (S83).

After the process of S83, the memory controller initializes the variable i to 0 (S84).

After the process of S84, the memory controller determines whether the correction status STSi is "1" (S85).

If the correction status STSi is "1" (S85; yes), the memory controller 10 adopts a shift amount group $\Delta Vth\_pi$, among the shift amount groups $\Delta Vth\_p0$, $\Delta Vth\_p1$ and $\Delta Vth\_p2$ computed in the process of S83 (S86).

If the correction status STSi is "0" (S85; no), the memory controller 10 computes a shift amount group ΔVth_ci by executing a fourth estimation method using the reliability information 31 (S87). The details of the fourth estimation method will be described later.

After the process of S87, the memory controller 10 executes a shift amount selection process (S88). The shift amount selection process is a process of selecting which of the shift amount group ΔVth_vi computed in the process of S81 and the shift amount group ΔVth_ci computed in the process of S87 is to be adopted. The details of the shift amount selection process will be described later.

After the process of S86 or the process of S88, the memory controller 10 determines whether the process with the adoption of the shift amount group ΔVth_i has been executed for all pages (S89). Specifically, in the case of the read process for the cell unit CU that is written by the TLC mode, the memory controller 10 determines whether the variable i is 2.

If there is a page for which the process with the adoption of the shift amount group ΔVth_i has not been executed (S89; no), the memory controller 10 increments the variable i (S90).

After the process of S90, the memory controller determines whether the correction status STSi is "1" (S85). Then, the subsequent processes of S86 to S89 are executed. In this manner, until the process with the adoption of the shift amount group ΔVth_i is executed for all pages, the processes of S85 to S89 are executed while the variable i is incremented in the process of S90.

If the process with the adoption of the shift amount group ΔVth_i has been executed for all pages (S89; yes), the memory controller 10 applies the shift amount group ΔVth_pi adopted in the process of S86, and the shift amount group ΔVth_vi or ΔVth_ci adopted in the process of S88, to the subsequent read process (S92).

If all the correction statuses STS0, STS1 and STS2 are "0" (S82; yes), the memory controller 10 adopts the shift amount groups ΔVth_v0, ΔVth_v1 and ΔVth_v2 computed in the process of S81 (S91).

After the process of S91, the memory controller applies the shift amount groups ΔVth_v0, ΔVth_v1 and ΔVth_v2 adopted in the process of S91 to the subsequent read process (S92).

If the process of S92 is finished, the fifth example of the shift amount estimation process ends (End).

3.2 Shift Amount Selection Process

Figure 21:
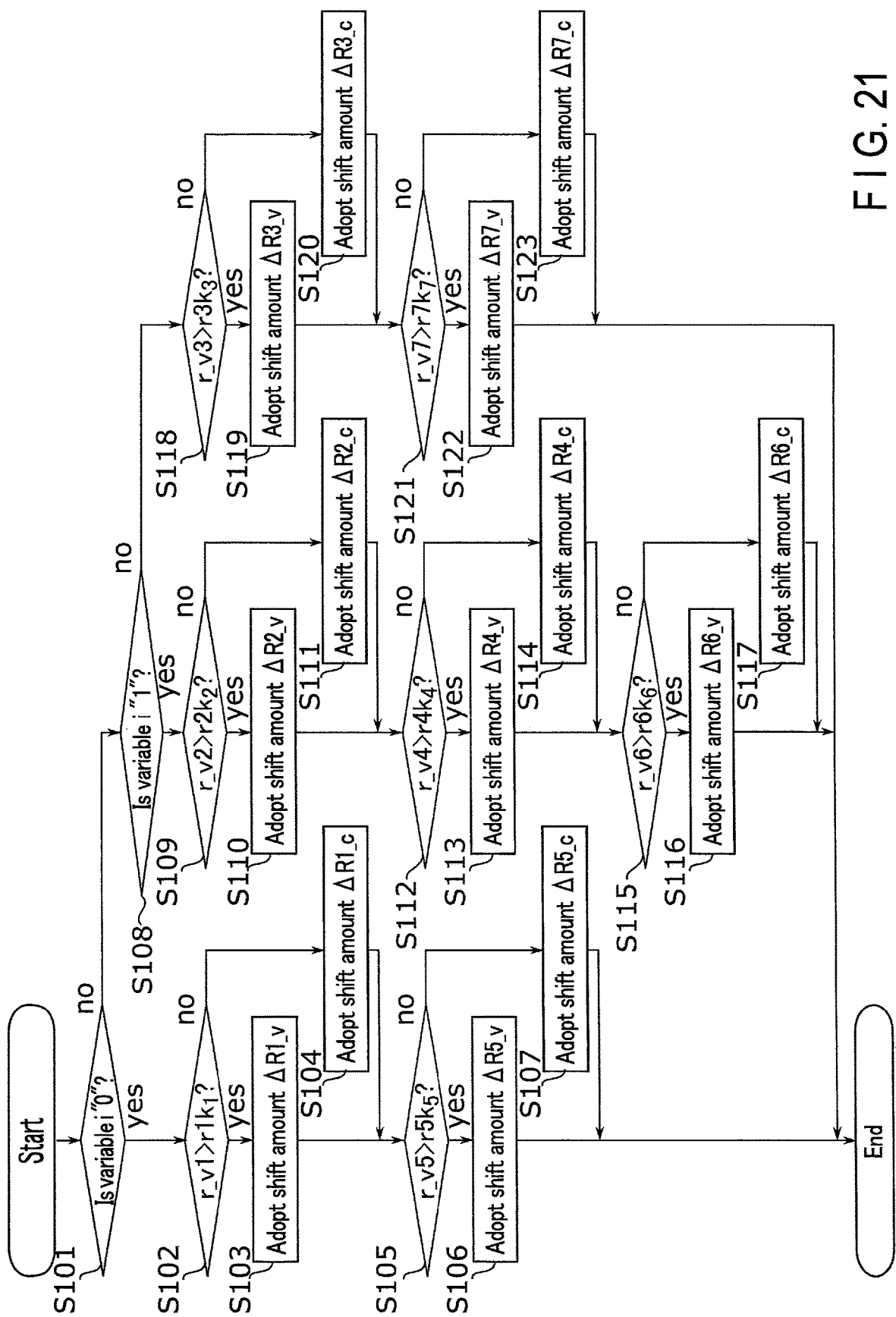
FIG. 21 is a flowchart illustrating an example of a shift amount selection process in the memory system according to the third embodiment.

FIG. 21 is a flowchart illustrating an example of a shift amount selection process in the memory system according to the third embodiment. The processes of S101 to 123 in FIG. 21 correspond to the process of S88. Note that in the following description, the shift amount ΔRx of the read voltage Rx is distinguished according to the estimation method that is applied. Specifically, the shift amount ΔRx in a case where the third estimation method is applied is expressed like a shift amount ΔRx_v. The shift amount ΔRx in a case where the fourth estimation method is applied is expressed like a shift amount ΔRx_c.

If the shift amount selection process is started (Start), the memory controller 10 determines whether the variable i is "0" (S101). Specifically, the memory controller 10 determines whether the shift amount group of the estimation destination corresponds to the lower page P0.

If the variable i is "0" (S101; yes), the memory controller 10 determines whether the reliability r_v1 of the shift amount ΔR1_v computed by the second estimation method in the process of S81 is greater than the reliability $r1k_1$ of the shift amount ΔR1_c computed by the fourth estimation method in the process of S87 (S102).

If the reliability r_v1 is greater than the reliability $r1k_1$ (r_v1>$r1k_1$) (S102; yes), the memory controller 10 adopts the shift amount ΔR1_v (S103).

If the reliability r_v1 is equal to or less than the reliability $r1k_1$ (r_v1≤$r1k_1$) (S102; no), the memory controller 10 adopts the shift amount ΔR1_c (S104).

Subsequently, the memory controller 10 determines whether the reliability r_v5 of the shift amount ΔR5_v computed by the second estimation method in the process of S81 is greater than the reliability $r5k_5$ of the shift amount ΔR5_c computed by the fourth estimation method in the process of S87 (S105).

If the reliability r_v5 is greater than the reliability $r5k_5$ (r_v5>$r5k_5$) (S105; yes), the memory controller 10 adopts the shift amount ΔR5_v (S106).

If the reliability r_v5 is equal to or less than the reliability $r5k_5$ (r_v5≤$r5k_5$) (S105; no), the memory controller 10 adopts the shift amount ΔR5_c (S107).

If the variable i is not "0" (S101; no), the memory controller 10 determines whether the variable i is "1" (S108). Specifically, the memory controller 10 determines whether the shift amount group of the estimation destination corresponds to the middle page P1.

If the variable i is "1" (S108; yes), the memory controller 10 determines whether the reliability r_v2 of the shift amount ΔR2_v computed by the second estimation method in the process of S81 is greater than the reliability $r2k_2$ of the shift amount ΔR2_c computed by the fourth estimation method in the process of S87 (S109).

If the reliability r_v2 is greater than the reliability $r2k_2$ (r_v2>$r2k_2$) (S109; yes), the memory controller 10 adopts the shift amount ΔR2_v (S110).

If the reliability r_v2 is equal to or less than the reliability $r2k_2$ (r_v2≤$r2k_2$) (S109; no), the memory controller 10 adopts the shift amount ΔR2_c (S111).

Subsequently, the memory controller 10 determines whether the reliability r_v4 of the shift amount ΔR4_v computed by the second estimation method in the process of S81 is greater than the reliability $r4k_4$ of the shift amount ΔR4_c computed by the fourth estimation method in the process of S87 (S112).

If the reliability r_v4 is greater than the reliability $r4k_4$ (r_v4>$r4k_4$) (S112; yes), the memory controller 10 adopts the shift amount ΔR4_v (S113).

If the reliability r_v4 is equal to or less than the reliability $r4k_4$ (r_v4≤$r4k_4$) (S112; no), the memory controller 10 adopts the shift amount ΔR4_c (S114).

Subsequently, the memory controller 10 determines whether the reliability r_v6 of the shift amount ΔR6_v computed by the second estimation method in the process of S81 is greater than the reliability $r6k_6$ of the shift amount ΔR6_c computed by the fourth estimation method in the process of S87 (S115).

If the reliability r_v6 is greater than the reliability $r6k_6$ (r_v6>$r6k_6$) (S115; yes), the memory controller 10 adopts the shift amount ΔR6_v (S116).

If the reliability r_v6 is equal to or less than the reliability $r6k_6$ (r_v6≤$r6k_6$) (S116; no), the memory controller 10 adopts the shift amount ΔR6_c (S117).

If the variable i is not "1" (S108; no), the memory controller 10 determines that the shift amount group of the estimation destination corresponds to the upper page P2. Then, the memory controller 10 determines whether the reliability r_v3 of the shift amount ΔR3_v computed by the second estimation method in the process of S81 is greater than the reliability $r3k_3$ of the shift amount ΔR3_c computed by the fourth estimation method in the process of S87 (S118).

If the reliability r_v3 is greater than the reliability $r3k_3$ (r_v3>$r3k_3$) (S118; yes), the memory controller 10 adopts the shift amount ΔR3_v (S119).

If the reliability r_v3 is equal to or less than the reliability $r3k_3$ (r_v3≤$r3k_3$) (S118; no), the memory controller 10 adopts the shift amount ΔR3_c (S120).

Subsequently, the memory controller 10 determines whether the reliability r_v7 of the shift amount ΔR7_v computed by the second estimation method in the process of S81 is greater than the reliability $r7k_7$ of the shift amount ΔR7_c computed by the fourth estimation method in the process of S87 (S121).

If the reliability r_v7 is greater than the reliability $r7k_7$ (r_v7>$r7k_7$) (S121; yes), the memory controller 10 adopts the shift amount ΔR7_v (S122).

If the reliability r_v7 is equal to or less than the reliability $r7k_7$ (r_v7≤$r7k_7$) (S121; no), the memory controller 10 adopts the shift amount ΔR7_c (S123).

After the process of S106 or the process of S107, after the process of S116 or the process of S117, or after the process of S122 or the process of S123, the shift amount selection process ends (End).

3.3 Advantageous Effects According to the Third Embodiment

According to the third embodiment, the memory controller 10 selects an estimation method with higher reliability between the third estimation method and the fourth estimation method. Thereby, the shift amount with higher likelihood can be applied to the page that failed in the error correction process. Thus, the optical read voltage can be computed with high precision.

4. Modifications and the Like

The first embodiment, second embodiment and third embodiment are not limited to the above-described examples, and various modifications are applicable.

4.1 First Modification

In the above first embodiment, second embodiment and third embodiment, the description was given of the case where all the shift amount groups ΔVth_p0, ΔVth_p1 and ΔVth_p2 are computed regardless of whether the first estimation method is applied, but the embodiments are not limited to this. For example, with respect to the page Pi to which the first estimation method is applied, the shift amount group ΔVth_pi may selectively be computed.

4.1.1 Read Process Including Shift Amount Estimation Process

Figure 22:
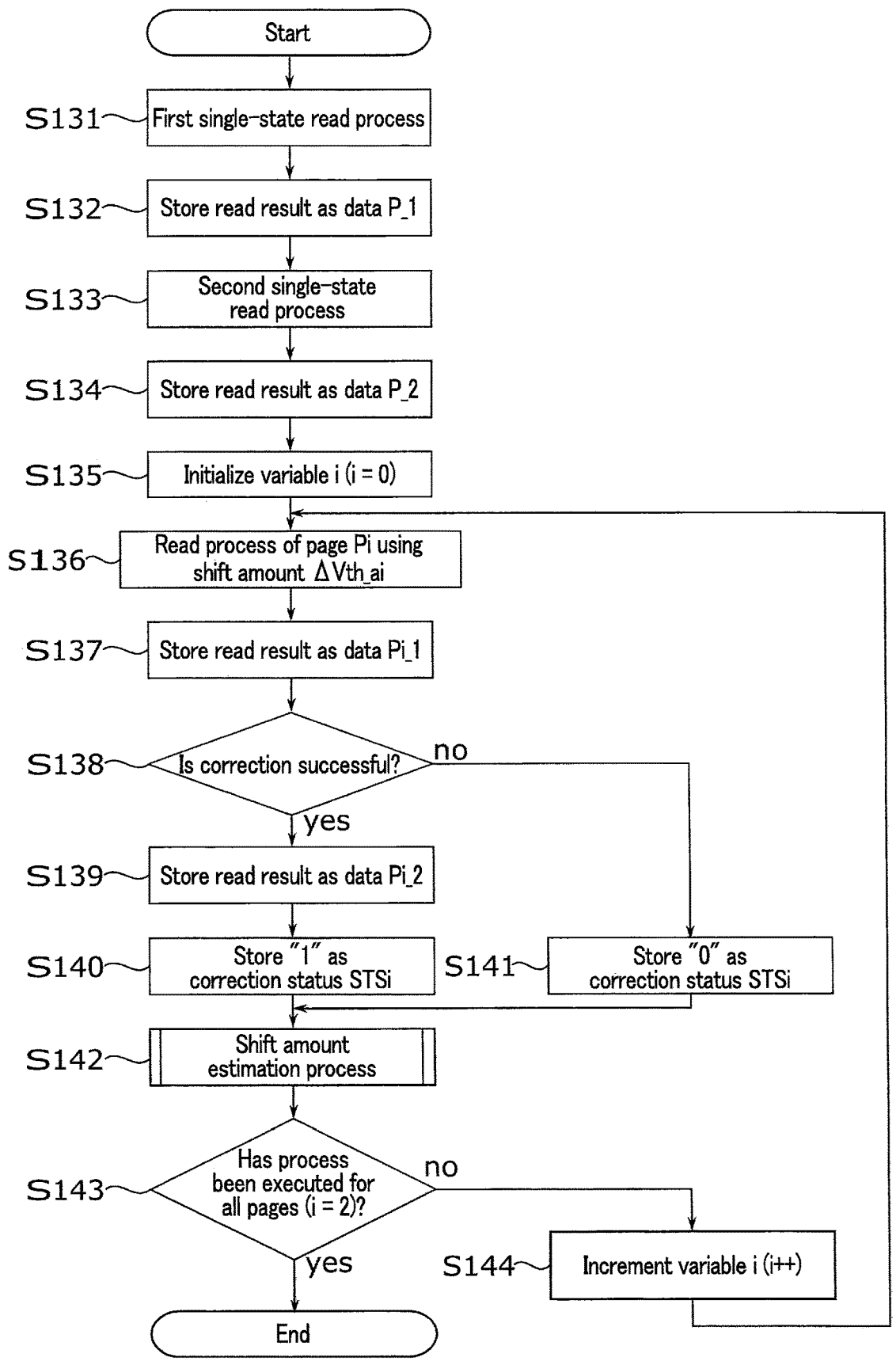
FIG. 22 is a flowchart illustrating an example of a read process including a shift amount estimation process in a memory system according to a first modification.

FIG. 22 is a flowchart illustrating an example of a read process including a shift amount estimation process in a memory system according to a first modification. FIG. 22 corresponds to FIG. 6 in the first embodiment.

If the read condition is satisfied (Start), the memory controller 10 causes the nonvolatile memory 20 to execute a first single-state read process (S131). The read voltage applied to the first single-state read process is, for example, R3.

The memory controller 10 causes the buffer memory 12 to store the data, which is read in the process of S131, as data P_1 (S132). By using the data P_1, the memory cell transistors MT corresponding to the data "1" of the lower page can be classified into memory cell transistors MT, the threshold voltage of which is the voltage R1 or less, and memory cell transistors MT, the threshold voltage of which is the voltage R5 or more. In addition, by using the data P_1, the memory cell transistors MT corresponding to the data "1" of the middle page can be classified into memory cell transistors MT, the threshold voltage of which is the voltage R2 or less, and memory cell transistors MT, the threshold voltage of which is the voltage R4 or more and the voltage R6 or less.

Subsequently, the memory controller 10 causes the nonvolatile memory 20 to execute a second single-state read process (S133). The read voltage applied to the second single-state read process is, for example, R5.

The memory controller 10 causes the buffer memory 12 to store the data, which is read in the process of S133, as data P_2 (S134). By using the data P_2, the memory cell transistors MT corresponding to the data "1" of the upper page can be classified into memory cell transistors MT, the threshold voltage of which is the voltage R7 or more, and memory cell transistors MT, the threshold voltage of which is the voltage R3 or less. In addition, by using the data P_2, the memory cell transistors MT corresponding to the data "1" of the middle page can be classified into memory cell transistors MT, the threshold voltage of which is the voltage R2 or more and the voltage R4 or less, and memory cell transistors MT, the threshold voltage of which is the voltage R6 or more.

The memory controller 10 initializes the variable i to "0" (S135).

After the process of S135, the memory controller 10 causes the nonvolatile memory 20 to execute the read process of the page Pi using the shift amount group ΔVth_ai (S136).

The memory controller 10 causes the buffer memory 12 to store the data, which is read in the process of S136, as data Pi_1 (S137).

The ECC circuit 16 of the memory controller 10 executes the error correction process for the data that is read in the process of S137 (S138).

If the error correction process is successful (S138; yes), the memory controller 10 causes the buffer memory 12 to store the corrected data as data Pi_2 (S139).

Then, the memory controller 10 causes the buffer memory 12 to store "1" indicative of the success of the error correction process as a correction status STSi (S140).

If the error correction process fails (S138; no), the memory controller 10 causes the buffer memory 12 to store "0" indicative of the failure of the error correction process as the correction status STSi (S141).

After the process of S140 or the process of S141, the memory controller 10 executes the shift amount estimation process (S142).

After the process of S142, the memory controller 10 determines whether the read process has been executed for all pages (S143). Specifically, in the case of the read process for the cell unit CU that is written by the TLC mode, the memory controller 10 determines whether the variable i is 2.

If there is a page for which the read process has not been executed (S143; no), the memory controller 10 increments the variable i (S144).

After the process of S144, the memory controller causes the nonvolatile memory 20 to execute the read process of a page Pi using a shift amount group ΔVth_ai (S136). Then, the subsequent processes of S137 to S143 are executed. In this manner, until the read process is executed for all pages (i.e., until the shift amount estimation process for all pages is executed), the processes of S136 to S143 are executed while the variable i is incremented in the process of S144.

If the read process has been executed for all pages (S143; yes), the read process including the shift amount estimation process ends (End).

4.1.2 Shift Amount Estimation Process

Figure 23:
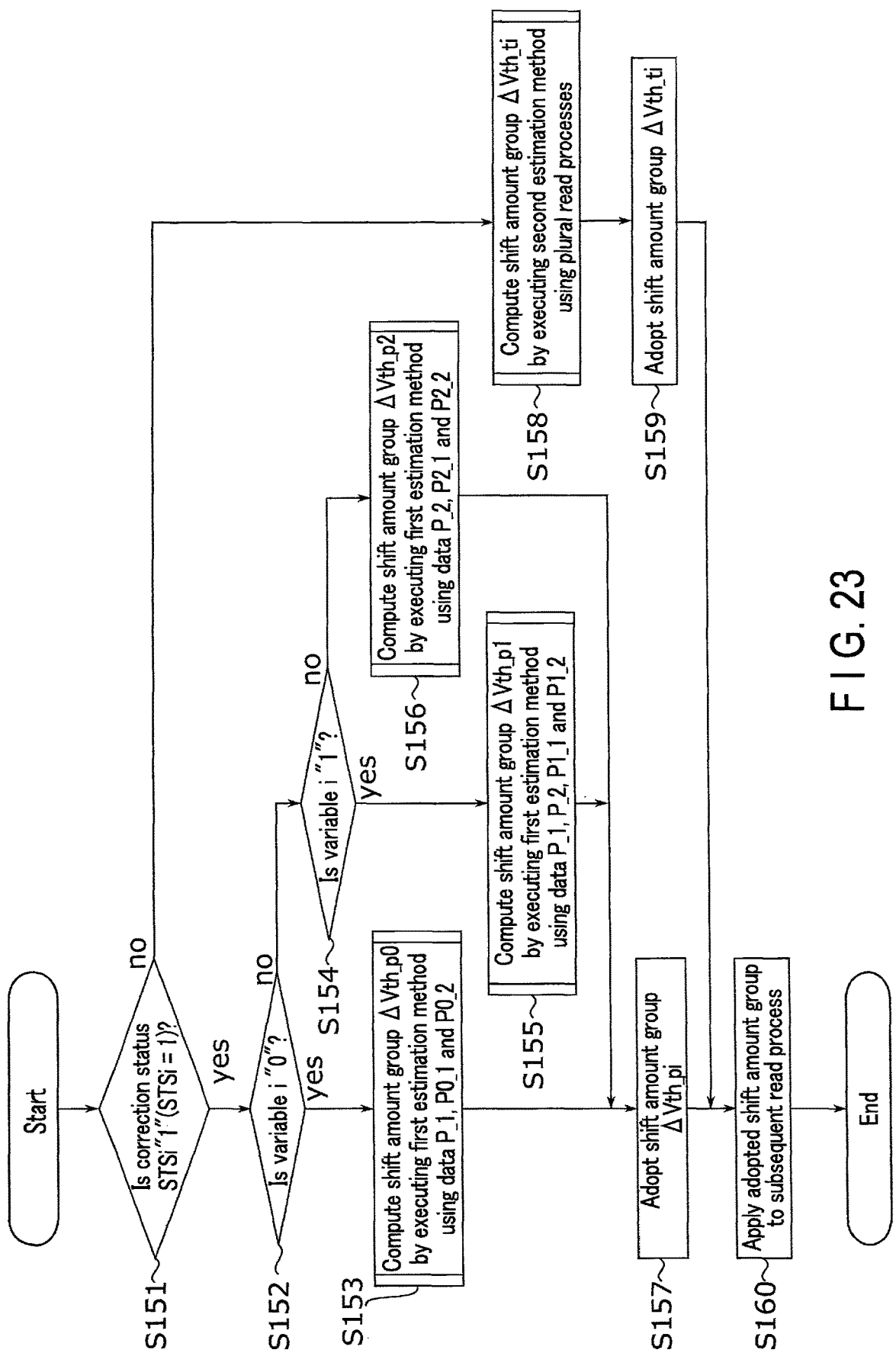
FIG. 23 is a flowchart illustrating an example of the shift amount estimation process in the memory system according to the first modification.

FIG. 23 is a flowchart illustrating an example of the shift amount estimation process in the memory system according to the first modification. The processes of S151 to S160 in FIG. 23 correspond to the process of S142 in FIG. 22.

If the shift amount estimation process is started (Start), the memory controller 10 determines whether the correction status STSi is "1" (S151).

If the correction status STSi is "1" (S151; yes), the memory controller 10 determines whether the variable i is "0" (S152). Specifically, the memory controller 10 determines whether the shift amount group of the estimation destination corresponds to the lower page P0.

If the variable i is "0" (S152; yes), the memory controller 10 computes a shift amount group ΔVth_p0 by executing the first estimation method using the data P_1, P0_1 and P0_2 (S153).

If the variable i is not "0" (S152; no), the memory controller 10 determines whether the variable i is "1" (S154). Specifically, the memory controller 10 determines whether the shift amount group of the estimation destination corresponds to the middle page P1.

If the variable i is "1" (S154; yes), the memory controller 10 determines that the shift amount group of the estimation destination corresponds to the middle page P1. Then, the memory controller 10 computes a shift amount group ΔVth_p1 by executing the first estimation method using the data P_1, P_2, P1_1 and P1_2 (S155).

If the variable i is not "1" (S154; no), the memory controller 10 computes a shift amount group ΔVth_p2 by executing the first estimation method using the data P_2, P2_1 and P2_2 (S156).

The memory controller 10 adopts the shift amount group ΔVth_pi computed in the process of S153, the process of S155 or the process of S156 (S157).

If the correction status STSi is not "1" (S151; no), the memory controller 10 computes an amount group ΔVth_ti by executing the second estimation method using a plurality of read processes (S158).

The memory controller 10 adopts the shift amount group ΔVth_ti computed in the process of S158 (S159).

After the process of S157 or the process of S159, the memory controller 10 applies the adopted shift amount group to the subsequent read process (S160).

If the process of S160 is finished, the shift amount estimation process ends (End).

4.1.3 Advantageous Effects According to the First Modification

According to the first modification, the memory controller 10 executes the first estimation method without completely using the data P0_1, P1_1, P2_1, P0_2, P1_2 and P2_2 of the six pages. Thereby, the memory controller 10 can be configured to not compute the shift amount group ΔVth_pi by the first estimation method, with respect to the page Pi that failed in the error correction process. Thus, the load of computation of the shift amount group in the memory controller 10 can be reduced.

4.2 Second Modification

In the above second embodiment and third embodiment, the description was given of the case where, in the fourth estimation method, the shift amount corresponding to the maximum reliability in the product set G is used as the estimation source, but the embodiments are not limited to this. For example, a shift amount group corresponding to a plurality of reliabilities (reliability group) of a threshold TH or more in the product set G may be used as the estimation source.

4.2.1 Fourth Estimation Method

Figure 24:
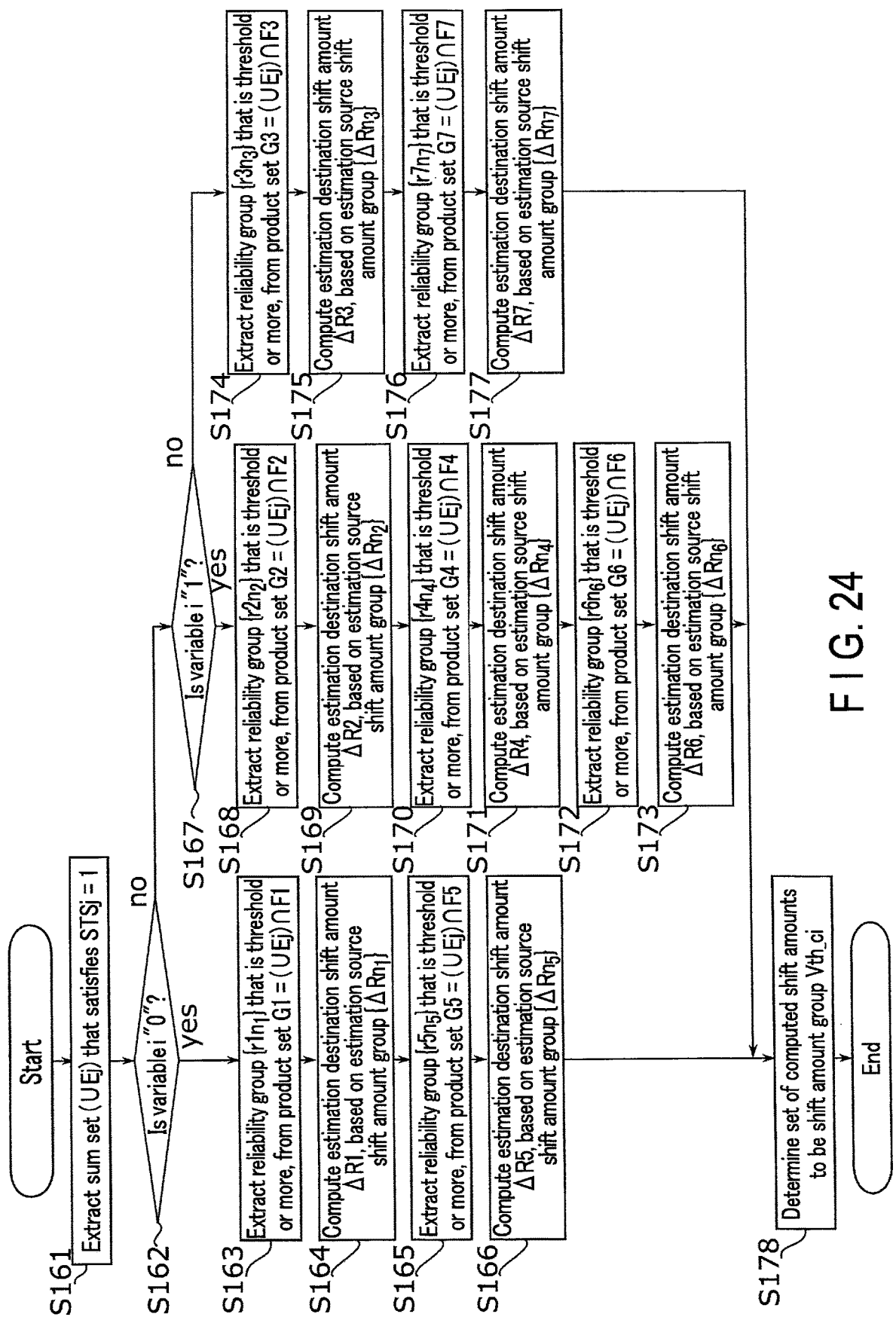
FIG. 24 is a flowchart illustrating an example of a fourth estimation method applied to a shift amount estimation process in a memory system according to a second modification.

FIG. 24 is a flowchart illustrating an example of a fourth estimation method applied to the shift amount estimation process in a memory system according to a second modification. FIG. 24 corresponds to the process of S46 in FIG. 15.

If the fourth estimation method is started (Start), the memory controller refers to the reliability information 31, and extracts a sum set ($\cup$Ej) that satisfies the correction status STSj=1 (S161).

The memory controller 10 determines whether the variable i is "0" (S162). Specifically, the memory controller 10 determines whether the shift amount group of the estimation destination corresponds to the lower page P0.

If the variable i is "0" (S162; yes), the memory controller 10 refers to the reliability information 31, and extracts a set of reliabilities (reliability group $\{r1n_1\}$) that is a threshold TH or more, from the product set G1 (S163). Here, $n_1$ is an integer of 1 or more and 7 or less. The threshold TH is a real number of 0 or more and 1 or less.

The memory controller 10 refers to the correction DB 32, and computes a shift amount ΔR1 of the estimation destination, based on a shift amount group $\{\Delta Rn_1\}$ of the estimation source corresponding to the reliability group $\{r1n_1\}$ extracted in the process of S163 (S164).

Subsequently, the memory controller 10 refers to the reliability information 31, and extracts a set of reliabilities (reliability group $\{r5n_5\}$) that is a threshold TH or more, from the product set G5 (S165). Here, $n_5$ is an integer of 1 or more and 7 or less.

The memory controller 10 refers to the correction DB 32, and computes a shift amount ΔR5 of the estimation destination, based on a shift amount group $\{\Delta Rn_5\}$ of the estimation source corresponding to the reliability group $\{r5n_5\}$ extracted in the process of S165 (S166).

If the variable i is not "0" (S161; no), the memory controller 10 determines whether the variable i is "1" (S167). Specifically, the memory controller 10 determines whether the shift amount group of the estimation destination corresponds to the middle page P1.

The memory controller 10 refers to the reliability information 31, and extracts a set of reliabilities (reliability group $\{r2n_2\}$) that is a threshold TH or more, from the product set G2 (S168). Here, $n_2$ is an integer of 1 or more and 7 or less.

The memory controller 10 refers to the correction DB 32, and computes a shift amount ΔR2 of the estimation destination, based on a shift amount group $\{\Delta Rn_2\}$ of the estimation source corresponding to the reliability group $\{r2n_2\}$ extracted in the process of S168 (S169).

Subsequently, the memory controller 10 refers to the reliability information 31, and extracts a set of reliabilities (reliability group $\{r4n_4\}$) that is a threshold TH or more, from the product set G4 (S170). Here, $n_4$ is an integer of 1 or more and 7 or less.

The memory controller 10 refers to the correction DB 32, and computes a shift amount ΔR4 of the estimation destination, based on a shift amount group $\{\Delta Rn_4\}$ of the estimation source corresponding to the reliability group $\{r4n_4\}$ extracted in the process of S170 (S171).

Subsequently, the memory controller 10 refers to the reliability information 31, and extracts a set of reliabilities (reliability group $\{r6n_6\}$) that is a threshold TH or more, from the product set G6 (S172). Here, $n_6$ is an integer of 1 or more and 7 or less.

The memory controller 10 refers to the correction DB 32, and computes a shift amount ΔR6 of the estimation destination, based on a shift amount group $\{\Delta Rn_6\}$ of the estimation source corresponding to the reliability group $\{r6n_6\}$ extracted in the process of S172 (S173).

If the variable i is not "1" (S167; no), the memory controller 10 determines that the shift amount group of the estimation destination corresponds to the upper page P2. Then, the memory controller 10 refers to the reliability information 31, and extracts a set of reliabilities (reliability group $\{r3n_3\}$) that is a threshold TH or more, from the product set G3 (S174). Here, $n_3$ is an integer of 1 or more and 7 or less.

The memory controller 10 refers to the correction DB 32, and computes a shift amount ΔR3 of the estimation destination, based on a shift amount group $\{\Delta Rn_3\}$ of the estimation source corresponding to the reliability group $\{r3n_3\}$ extracted in the process of S174 (S175).

Subsequently, the memory controller 10 refers to the reliability information 31, and extracts a set of reliabilities (reliability group $\{r7n_7\}$) that is a threshold TH or more, from the product set G7 (S176). Here, $n_7$ is an integer of 1 or more and 7 or less.

The memory controller 10 refers to the correction DB 32, and computes a shift amount ΔR7 of the estimation destination, based on a shift amount group $\{\Delta Rn_7\}$ of the estimation source corresponding to the reliability group $\{r7n_7\}$ extracted in the process of S176 (S177).

After the processes of S164 and S166, after the processes of S169, S171 and S173, or after the processes of S175 and S177, the memory controller 10 determines the set of computed shift amounts to be the shift amount group Vth_ci (S178).

If the process of S178 is finished, the fourth estimation method ends (End).

Figure 25:
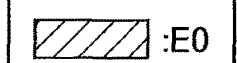
FIG. 25 is a view illustrating an example of the fourth estimation method applied to the shift amount estimation process in the memory system according to the second modification.

FIG. 25 is a view illustrating an example of the fourth estimation method applied to the shift amount estimation process in the memory system according to the second modification. In FIG. 25, the processes of S161 and S170 in FIG. 24 are illustrated based on FIG. 13. To be more specific, FIG. 25 illustrates a case of $\{n_4\}=\{3, 5\}$, as an example of the case of estimating the estimation destination shift amount ΔR4 in a case where i=1, STS0=1, STS1=0, and STS2=1.

As illustrated in FIG. 25, the memory controller refers to the reliability information 31, and extracts a set E0∪E2 as a sum set (∪ Ej), since both the error correction process of the lower page P0 and the error correction process of the upper page P2 are successfully executed in the computation of the shift amount group ΔVth_c1 of the middle page P1 (S161).

The memory controller 10 extracts, as the product set G4, a product set G4={r41, r43, r45, r47} between the set E0 ∪ E2 and the set F4. Then, the memory controller 10 extracts r43 and r45 as the reliability group $\{r4n_4\}$) that is the threshold TH or more, from the product set G4 (S170). Thereby, the memory controller 10 determines the shift amount ΔR3 corresponding to the reliability r43 and the shift amount ΔR5 corresponding to the reliability r45 to be the estimation source shift amount for the estimation destination shift amount ΔR4.

Thereafter, by referring to the correction DB 32, the estimation destination shift amount ΔR4(3) corresponding to the estimation source shift amount ΔR3, and the estimation destination shift amount ΔR4(5) corresponding to the estimation source shift amount ΔR5, are computed. Then, the memory controller 10 computes the estimation destination shift amount ΔR4, for example, based on the estimation destination shift amounts ΔR4(3) and ΔR4(5) (S171).

For example, the memory controller 10 may compute an interpolation value of the estimation destination shift amounts ΔR4(3) and ΔR4(5) as the estimation destination shift amount ΔR4, based on the large/small relationship between the reliabilities r43 and r45. Concretely, in the case where the estimation destination shift amounts ΔR4(3) and ΔR4(5) are −9 and −11, respectively, and where the reliabilities r43 and r45 are 0.74 and 0.82, respectively, the memory controller 10 can compute the estimation destination shift amount ΔR4, for example, in accordance with the following equation.

$$\Delta R4 = \Delta R4(3) \times r43/(r43+r45) + \Delta R4(5) \times r45/(r43+r45) = \\ (-9) \times 0.74/(0.82+0.74) + (-11) \times 0.82/(0.74+0.82) \\ = -10$$

4.2.2 Advantageous Effects According to the Second Modification

According to the second modification, in the fourth estimation method, the memory controller 10 uses, as the shift amounts of the estimation source, the plural shift amounts corresponding to the reliabilities of the threshold TH or more. Thereby, the shift amount, in which the correlation with each of the plural shift amounts is taken into account, can be computed. Thus, the shift amounts can be estimated with high precision.

4.3 Others

Besides, in the above first embodiment, second embodiment and third embodiment, the description was given of the case where 3-bit data can be stored in one memory cell transistor MT, but the embodiments are not limited to this, and are applicable to cases where data of 2 bits, 4 bits, or 5 or more bits can be stored.

Furthermore, in the above second embodiment and third embodiment, the description was given of the case where the state corresponding to the shift amount of the estimation source neighbors the state corresponding to the shift amount of the estimation destination, but the embodiments are not limited to this. For example, the state corresponding to the shift amount of the estimation source may be at a distance from the state corresponding to the shift amount of the estimation destination.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a nonvolatile memory including a plurality of memory cells; and
a memory controller, wherein
each of the plurality of memory cells is configured to store a first bit and a second bit, and
the memory controller is configured to:
read a first data by using a first voltage to a first read process that reads data corresponding to the first bit from the memory cells;
read a second data by using a second voltage to a second read process that reads data corresponding to the second bit from the memory cells;
in a case where an error correction process of the first data is successful,
determine a third voltage, based on the first data and a third data that is obtained by error-correcting the first data; and
update a first read voltage that is used to the first read process, from the first voltage to the third voltage.

2. The memory system of claim 1, wherein
in a case where the error correction process of the first data fails, the memory controller is configured to:
read a plurality of data corresponding to the first bit from the plurality of memory cells, while shifting a read voltage;
determine a fourth voltage, based on the plurality of data; and
update the first read voltage from the first voltage to the fourth voltage.

3. The memory system of claim 1, wherein
in a case where the error correction process of the first data fails, the memory controller is configured to:
determine a fifth voltage, based on the first data, the second data, the first voltage and the second voltage; and
update the first read voltage from the first voltage to the fifth voltage.

4. The memory system of claim 1, wherein
the memory controller is configured to:
read the second data by further using a sixth voltage to the second read process; and
in a case where the error correction process of the first data fails and an error correction process of the second data is successful,
determine a seventh voltage and an eighth voltage based on the second data and fourth data, the fourth data being obtained by error-correcting the second data;
update a second read voltage and a third read voltage, which are used to the second read process, from the second voltage and the sixth voltage to the seventh voltage and the eighth voltage;
select at least one voltage from the seventh voltage and the eighth voltage;
determine a ninth voltage, based on the selected voltage and a reliability of the first read voltage determined from the selected voltage; and
update the first read voltage from the first voltage to the ninth voltage.

5. The memory system of claim 4, wherein
the memory controller is configured to:
select one voltage corresponding to a maximum reliability between a first reliability of the first read voltage determined from the seventh voltage and a second reliability of the first read voltage determined from the eighth voltage.

6. The memory system of claim 5, wherein
in a case where the maximum reliability is less than a first threshold, the memory controller is configured to:
determine a tenth voltage, based on the first data, the second data, the first voltage, the second voltage and the sixth voltage; and
update the first read voltage from the first voltage to the tenth voltage.

7. The memory system of claim 4, wherein
the memory controller is configured to:
select at least one voltage corresponding to a reliability of a second threshold or more between a first reliability of the first read voltage determined from the seventh voltage and a second reliability of the first read voltage determined from the eighth voltage.

8. The memory system of claim 1, wherein
each of the plurality of memory cells is configured to further store a third bit, and
the memory controller is configured to:
read fifth data by using an eleventh voltage to a third read process that reads data corresponding to the third bit from the plurality of memory cells; and
in a case where the error correction process of the first data fails, an error correction process of the second data is successful and an error correction process of the third data is successful,
determine a seventh voltage based on the second data and fourth data, the fourth data being obtained by error-correcting the second data;
update a second read voltage used to the second read process, from the second voltage to the seventh voltage;
determine a twelfth voltage based on the third data and sixth data, the sixth data being obtained by error-correcting the third data;
update a third read voltage used to the third read process, from the eleventh voltage to the twelfth voltage;
select at least one voltage between the seventh voltage and the twelfth voltage;
determine a ninth voltage, based on the selected voltage and a reliability of the first read voltage determined from the selected voltage; and
update the first read voltage from the first voltage to the ninth voltage.

9. The memory system of claim 8, wherein
the memory controller is configured to:
select one voltage corresponding to a maximum reliability between a first reliability of the first read voltage determined from the seventh voltage and a third reliability of the first read voltage determined from the eleventh voltage.

10. The memory system of claim 9, wherein
in a case where the maximum reliability is less than a first threshold, the memory controller is configured to:

determine a thirteenth voltage, based on the first data, the second data, the third data, the first voltage, the second voltage and the eleventh voltage; and update the first read voltage from the first voltage to the thirteenth voltage.

11. The memory system of claim 8, wherein the memory controller is configured to:

select at least one voltage corresponding to a reliability of a threshold or more between a first reliability of the first read voltage determined from the seventh voltage and a second reliability of the first read voltage determined from the eleventh voltage.

12. The memory system of claim 1, wherein the nonvolatile memory further includes a word line, and the plurality of memory cells are coupled to the word line.

13. The memory system of claim 12, wherein in a case where the error correction process of the second data fails, the memory controller is configured to:

read a plurality of data corresponding to the second bit from the memory cells, while shifting a read voltage;

determine a fourteenth voltage, based on the plurality of data; and update the second read voltage from the second voltage to the fourteenth voltage.

14. The memory system of claim 4, wherein the reliability is indicative of a correlation between the selected voltage and the first read voltage.

15. The memory system of claim 4, wherein the nonvolatile memory includes a word line being connected to the plurality of memory cells, in the first read process, the first read voltage is applied to the word line, in the second read process, the second read voltage and the third read voltage are applied to the word line.

16. A memory system comprising:

a nonvolatile memory including a plurality of memory cells; and a memory controller, wherein each of the plurality of memory cells is configured to store a first bit and a second bit, and the memory controller is configured to:

read a first data by using a first voltage to a first read process that reads data corresponding to the first bit from the plurality of memory cells;

read a second data by using a second voltage to a second read process that reads data corresponding to the second bit from the plurality of memory cells;

determine a third voltage, based on the first data, the second data, the first voltage and the second voltage; and update the first read voltage from the first voltage to the third voltage.

17. The memory system of claim 16, wherein the memory controller is configured to determine the third voltage by inputting the first data, the second data, the first voltage and the second voltage to a linear matrix.

18. The memory system of claim 16, wherein the memory controller is configured to determine the third voltage by inputting the first data, the second data, the first voltage and the second voltage to a neural matrix.

19. The memory system of claim 16, wherein the nonvolatile memory includes a word line being connected to the plurality of memory cells, in the first read process, the first read voltage is applied to the word line, in the second read process, the second voltage is applied to the word line.

* * * * *